(12) United States Patent
Chesterfield

(10) Patent No.: US 8,343,381 B1
(45) Date of Patent: *Jan. 1, 2013

(54) HOLE TRANSPORT COMPOSITION

(75) Inventor: Reid John Chesterfield, Santa Barbara, CA (US)

(73) Assignee: E I du Pont de Nemours and Company, Wilmington, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 12/467,531

(22) Filed: May 18, 2009

Related U.S. Application Data

(60) Provisional application No. 61/053,679, filed on May 16, 2008.

(51) Int. Cl.
*H01B 1/00* (2006.01)
*H01L 29/08* (2006.01)
*C08G 73/00* (2006.01)
*H01J 1/62* (2006.01)

(52) U.S. Cl. ........... 252/500; 257/40; 313/504; 528/422

(58) Field of Classification Search .................. 252/500; 313/504; 257/40; 528/422
See application file for complete search history.

(56) References Cited

U.S. PATENT DOCUMENTS

| | | | |
|---|---|---|---|
| 5,707,747 A | 1/1998 | Tomiyama et al. | |
| 5,929,194 A * | 7/1999 | Woo et al. | 528/229 |
| 5,962,631 A | 10/1999 | Woo et al. | |
| 6,259,202 B1 | 7/2001 | Sturm et al. | |
| 6,303,238 B1 | 10/2001 | Thompson et al. | |
| 6,670,645 B2 | 12/2003 | Grushin et al. | |
| 6,872,475 B2 | 3/2005 | Chen et al. | |
| 6,953,705 B2 | 10/2005 | Prakash | |
| 7,023,013 B2 | 4/2006 | Ricks et al. | |
| 7,189,989 B2 | 3/2007 | Ise | |
| 7,235,420 B2 | 6/2007 | Prakash et al. | |
| 7,540,978 B2 | 6/2009 | Pfeiffer et al. | |
| 7,745,017 B2 | 6/2010 | Nakamura et al. | |
| 7,887,933 B2 * | 2/2011 | Kathirgamanathan et al. | 428/690 |
| 8,063,399 B2 * | 11/2011 | Johansson et al. | 257/40 |
| 2001/0026878 A1 * | 10/2001 | Woo et al. | 428/690 |
| 2002/0155319 A1 | 10/2002 | Kawamura et al. | |
| 2003/0168970 A1 | 9/2003 | Tominaga et al. | |
| 2003/0224205 A1 | 12/2003 | Li et al. | |
| 2004/0004433 A1 * | 1/2004 | Lamansky et al. | 313/506 |
| 2004/0038459 A1 | 2/2004 | Brown et al. | |
| 2004/0082250 A1 | 4/2004 | Haoto | |
| 2004/0102577 A1 | 5/2004 | Hsu et al. | |

(Continued)

FOREIGN PATENT DOCUMENTS

EP 681019 A2 9/1999

(Continued)

OTHER PUBLICATIONS

Colon et al—High Molecular Weight Aromatic Polymers by Nickel Coupling of Aryl Polychlorides; Journal of Polymer Science, Part A, Polymer Chemistry Edition, 1990, vol. 28: 367.

(Continued)

*Primary Examiner* — Mark Kopec
*Assistant Examiner* — Jaison Thomas

(57) ABSTRACT

There is provided a hole transport composition having (i) a first hole transport polymer having crosslinkable groups, and (ii) a second hole transport polymer having substantially no crosslinkable groups. There is also provided a crosslinked hole transport layer and an electronic device containing the crosslinked hole transport layer.

5 Claims, 1 Drawing Sheet

U.S. PATENT DOCUMENTS

| | | | |
|---|---|---|---|
| 2004/0127637 A1 | 7/2004 | Hsu et al. | |
| 2004/0263067 A1 | 12/2004 | Saitoh et al. | |
| 2005/0073249 A1 | 4/2005 | Morii et al. | |
| 2005/0184287 A1 | 8/2005 | Herron et al. | |
| 2005/0186106 A1 | 8/2005 | Li et al. | |
| 2005/0191776 A1* | 9/2005 | Lamansky et al. | 438/22 |
| 2005/0205860 A1 | 9/2005 | Hsu et al. | |
| 2006/0033421 A1 | 2/2006 | Matsuura et al. | |
| 2006/0063852 A1 | 3/2006 | Iwata et al. | |
| 2006/0216411 A1 | 9/2006 | Steudel et al. | |
| 2007/0031588 A1 | 2/2007 | Nakayama | |
| 2007/0032632 A1 | 2/2007 | Tsukioka et al. | |
| 2007/0079927 A1* | 4/2007 | Lamansky et al. | 156/230 |
| 2007/0096082 A1* | 5/2007 | Gaynor et al. | 257/40 |
| 2007/0181874 A1 | 8/2007 | Prakash et al. | |
| 2007/0228364 A1* | 10/2007 | Radu et al. | 257/40 |
| 2007/0285009 A1 | 12/2007 | Kubota | |
| 2008/0071049 A1* | 3/2008 | Radu et al. | 526/242 |
| 2008/0097076 A1* | 4/2008 | Radu et al. | 528/422 |
| 2008/0102312 A1* | 5/2008 | Parham et al. | 428/704 |
| 2008/0138655 A1* | 6/2008 | Lecloux et al. | 428/690 |
| 2009/0051281 A1 | 2/2009 | Inoue | |
| 2009/0184635 A1* | 7/2009 | Pan et al. | 313/504 |
| 2009/0206748 A1 | 8/2009 | Moriwaki et al. | |
| 2010/0108989 A1 | 5/2010 | Büsing et al. | |
| 2010/0187506 A1 | 7/2010 | Park et al. | |
| 2011/0095269 A1 | 4/2011 | Zhang et al. | |

FOREIGN PATENT DOCUMENTS

| | | | |
|---|---|---|---|
| EP | 1277824 A1 | 1/2003 | |
| EP | 1624500 A1 | 2/2006 | |
| EP | 1933603 A1 | 6/2008 | |
| JP | 08167479 A | 6/1996 | |
| JP | 11338172 A | 12/1999 | |
| JP | 2000068073 A | 3/2000 | |
| JP | 2000186066 A | 7/2000 | |
| JP | 2001226331 A | 8/2001 | |
| JP | 2003026641 A | 1/2003 | |
| JP | 2003238501 A | 8/2003 | |
| JP | 2004014187 A | 1/2004 | |
| JP | 2004107292 A | 4/2004 | |
| JP | 2006328037 A | 12/2006 | |
| JP | 2007182432 A | 7/2007 | |
| KR | 1020050073233 A | 7/2005 | |
| KR | 100702763 B1 | 4/2007 | |
| KR | 1020070091293 A | 9/2007 | |
| KR | 100765728 B1 | 10/2007 | |
| WO | 9954385 A1 | 10/1999 | |
| WO | 0053565 A1 | 9/2000 | |
| WO | 0070655 A2 | 11/2000 | |
| WO | 0141512 A1 | 6/2001 | |
| WO | 03008424 A1 | 1/2003 | |
| WO | 03040257 A1 | 5/2003 | |
| WO | 03063555 A1 | 7/2003 | |
| WO | 03091688 A2 | 11/2003 | |
| WO | 2004016710 A1 | 2/2004 | |
| WO | 2004041901 A1 | 5/2004 | |
| WO | 2005049546 A1 | 6/2005 | |
| WO | 2005049548 A1 | 6/2005 | |
| WO | 2005049689 A2 | 6/2005 | |
| WO | 2005052027 A1 | 6/2005 | |
| WO | 2006063852 A1 | 6/2006 | |
| WO | 2007065678 A1 | 6/2007 | |
| WO | 2007076146 A2 | 7/2007 | |
| WO | WO 2008011953 A1 * | 1/2008 | |
| WO | 2009067419 A1 | 5/2009 | |

OTHER PUBLICATIONS

Eaton et al—Dihedral Angle of Biphenyl in Solution and the Molecular Force Field; J. Chem. Soc. Faraday Trans. 2, 1973, 60 pp. 1601-1608.

He et al—A Hole-Transporting Material With Controllable Morphology Containing Binaphthyl and Triphenylamine Chromophores; Advanced Functional Materials, vol. 16, No. 10, 2006, pp. 1343-1348.

Kawamura—Aromatic Oligoamine Derivatives, Their Hole Injection-Transporting Materials, and Their Organic EL Devices With Low Driving Voltage, 2003, 673842.

Shimamura—New Amine Compound for Organic Electroluminescent Device Showign Longer Luminescent Lifetime and Excellent Durability, Chemial Abstracts, 2001, 603530.

Yamamoto et al, Electrically conducting and thermally stable pi-conjugated poly(arylene)s prepared by organometallic process, Progress in Polymer Science, vol. 17, pp. 1153-1205, 1992.

PCT International Search Report for Application No. PCT/US2008/083844, S. Saldamli, Authorized Officer, Jan. 28, 2009.

PCT International Search Report for Application No. PCT/US2008/065191; W. Fitz, Authorized Officer, Apr. 9, 2008.

PCT International Search Report for Application No. PCT/US2008/065016; M. Redecker, Authorized Officer, Oct. 12, 2008.

Chen et al—Efficient, Blue Light-Emitting Diodes Using Cross-Linked Layers of Polymeric Arylamine and Fluorene, Synthetic Metals 107, 1999 pp. 129-135.

Gustafsson et al.—Flexible Light-Emitting Diodes Made From Soluble Conducting Polymers, 1992 vol. 357 pp. 477-479.

He et al—High-Efficiency Organic Polymer Light-Emitting Heterostructure Devices on Flexible Plastic Substates, 2000, Applied Physics Letters, vol. 76, No. 6, pp. 661-663.

He et al., "High-efficiency Organic Polymer Light-emitting Heterostructure Devices on Flexible Plastic Substrates," Feb. 2000; American Institute of Physics, Chem Abstract 132: 229208.

Markus—Photoconductive Cell, Electronics and Nucleonics Dictionary, 1966, pp. 470, 471 and 476 McGraw-Hill.

Nakatsuka et al., "Organic Field-effect Electroluminescent Devices with Long Lifetime," 1999, Mitsui Chemicals Inc., Japan, Chem Abstract 131: 191677.

Nakatsuka et al., "Preparation of 2,7-bis[(bisdiarylamino)aryl] fluorine Derivatives as Hole-transport Materials for Organic Electroluminescent Devices," 2001, Mitsui Chemicals Inc., Japan, Chem Abstract 134: 172027.

Wang—Photoconductive Materials, Kirk-Othmer Encyclopedia of Chemical Technology, Fourth Edition, 1996, vol. 18 pp. 837-860.

Zhu et al., "Effect of ITO Carrier Concentration on the Performance of Light-Emitting Diodes," 2000; Material Research Society; Chem Abstract 134: 122994.

PCT International Search Report for International Application No. PCT/US2007/018530, C. Meiners Authorized Officer, Feb. 7, 2008.

PCT International Search Report for International Application No. PCT/US2007/018531, D. Marsitzky Authorized Officer, Feb. 26, 2008.

Borello et al., "Photodetectors," Kirk-Othmer Encyclopedia of Chemical Technology, Fourth Edition, 1999, vol. 18, pp. 1537-1538.

Lee et al., "A Thermally Stable Hole Injection Material for Use in Organic Light-Emitting Diodes," Thin Solid Films, 2007, vol. 515, pp. 7726-7731.

Noji et al., "A New Catalytic System for Aerobic Oxidative Coupling of 2-Naphthol Derivatives by the Use of CuCl-Amine Complex: a Practical Synthesis of Binaphthol Derivatives," Tetrahedron Letters, 1994, vol. 35, No. 43, pp. 7983-7984.

Zhao et al., "Solid-State Dye-Sensitized Photovoltaic Device with Newly Designed Small Organic Molecule as Hole-Conductor," Chemical Physical Letters, 2007, vol. 445, pp. 259-264.

Extended European Search Report for Application No. 09830950.3; A. Bernabe Prieto, Examiner; EPO; Jun. 1, 2012.

Extended European Search Report for Application No. 09831094.9; Gunther Scheid, Examiner; EPO; Jun. 13, 2012.

First Official Action; EPO; Application No. 08756397.9, counterpart to U.S. Appl. No. 12/129,785; Oct. 27, 2011.

* cited by examiner

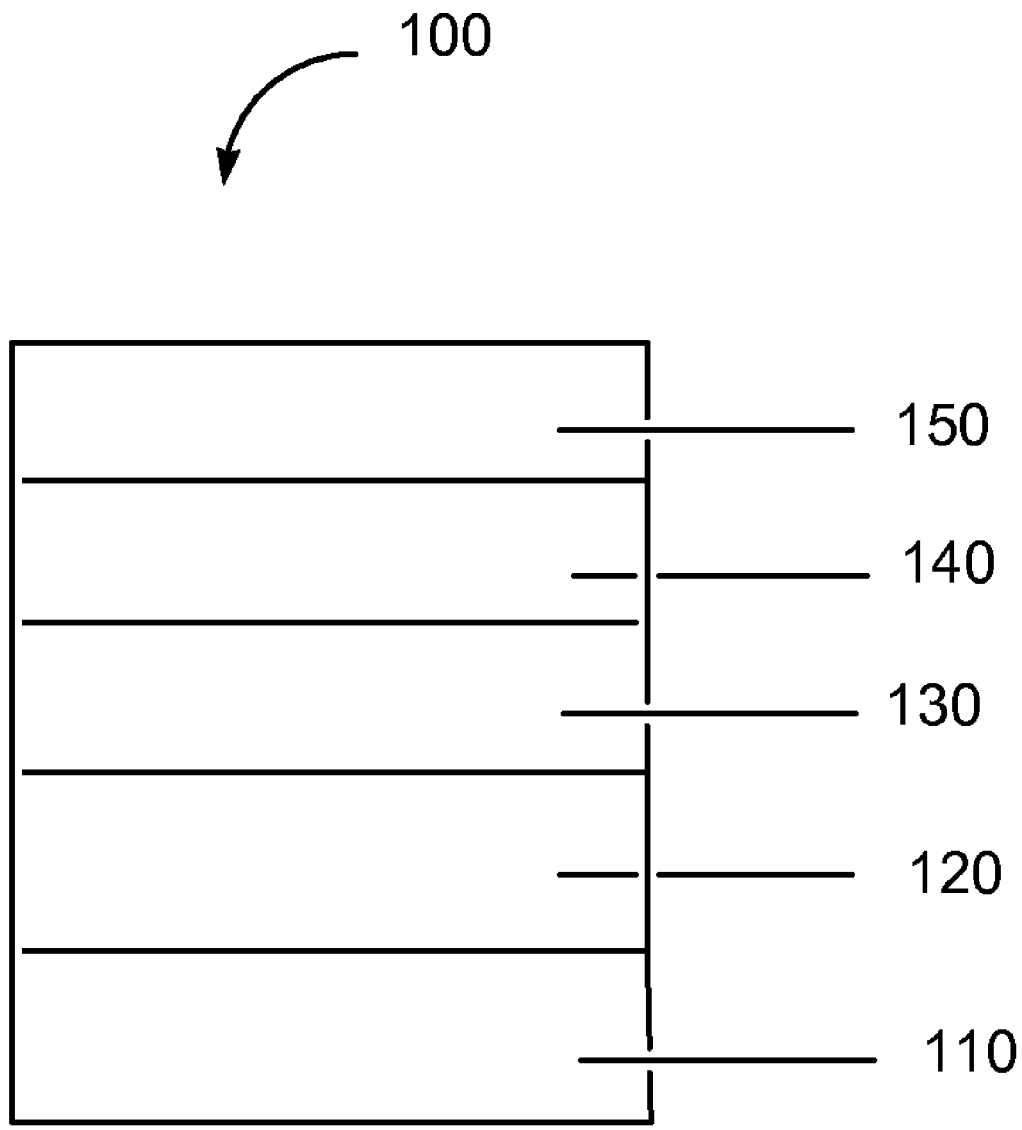

HOLE TRANSPORT COMPOSITION

RELATED APPLICATION

This application claims priority under 35 U.S.C. §119(e) from U.S. Provisional Application No. 61/053,679 filed May 16, 2008 which is incorporated by reference in its entirety.

BACKGROUND INFORMATION

1. Field of the Disclosure

This disclosure relates in general to hole transport compositions having more than one component. Such layers are useful in electronic devices.

2. Description of the Related Art

In organic photoactive electronic devices, such as organic light emitting diodes ("OLED"), that make up OLED displays, the organic active layer is sandwiched between two electrical contact layers. In an OLED the organic photoactive layer emits light through the light-transmitting electrical contact layer upon application of a voltage across the electrical contact layers.

It is well known to use organic electroluminescent compounds as the active component in light-emitting diodes. Simple organic molecules, conjugated polymers, and organometallic complexes have been used. Devices that use photoactive materials frequently include one or more charge transport layers, which are positioned between a photoactive (e.g., light-emitting) layer and a contact layer. A hole transport layer can be positioned between the photoactive layer and the hole-injecting contact layer. The hole-injecting contact layer may also be called the anode. An electron transport layer can be positioned between the photoactive layer and the electron-injecting contact layer. The electron-injecting contact layer may also be called the cathode.

There is a continuing need for charge transport materials for use in electronic devices.

SUMMARY

There is provided a hole transport composition comprising (i) a first hole transport polymer having crosslinkable groups, and (ii) a second hole transport polymer having substantially no crosslinkable groups.

In some embodiments, the first hole transport polymer is a copolymer of a triarylamine derivative and a fluorene derivative and the second hole transport polymer is a triarylamine polymer.

There is also provided a crosslinked hole transport layer made from the above hole transport composition.

There is also provided an electronic device having the above crosslinked hole transport layer.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

FIG. 1 includes an illustration of one example of an organic electronic device.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the First Hole Transport Polymer, the Second Hole Transport Polymer, the Hole Transport Composition and Layer, the Electronic Device, and finally Examples.

1. Definitions and Clarification of Terms

Before addressing details of embodiments described below, some terms are defined or clarified.

As used herein, the term "alkyl" includes branched and straight-chain saturated aliphatic hydrocarbon groups. Unless otherwise indicated, the term is also intended to include cyclic groups. Examples of alkyl groups include methyl, ethyl, propyl, isopropyl, isobutyl, secbutyl, tertbutyl, pentyl, isopentyl, neopentyl, cyclopentyl, hexyl, cyclohexyl, isohexyl and the like. The term "alkyl" further includes both substituted and unsubstituted hydrocarbon groups. In some embodiments, the alkyl group may be mono-, di- and tri-substituted. One example of a substituted alkyl group is trifluoromethyl. Other substituted alkyl groups are formed from one or more of the substituents described herein. In certain embodiments alkyl groups have 1 to 20 carbon atoms. In other embodiments, the group has 1 to 6 carbon atoms. The term is intended to include heteroalkyl groups. Heteroalkyl groups may have from 1-20 carbon atoms. The term "aryl" means an aromatic carbocyclic moiety of up to 30 carbon atoms, which may be a single ring (monocyclic) or multiple rings (bicyclic, up to three rings) fused together or linked covalently. Any suitable ring position of the aryl moiety may be covalently linked to the defined chemical structure. Examples of aryl moieties include, but are not limited to, phenyl, 1-naphthyl, 2-naphthyl, dihydronaphthyl, tetrahydronaphthyl, biphenyl, anthryl, phenanthryl, fluorenyl, indanyl, biphenylenyl, acenaphthenyl, acenaphthylenyl, and the like. In some embodiments, aryl groups have 6 to 30 carbon atoms. The term is intended to include heteroaryl groups. Heteroaryl groups may have from 4-30 carbon atoms.

The term "alkoxy" is intended to mean the group —OR, where R is alkyl.

The term "aryloxy" is intended to mean the group —OR, where R is aryl.

Unless otherwise indicated, all groups can be substituted or unsubstituted. An optionally substituted group, such as, but not limited to, alkyl or aryl, may be substituted with one or more substituents which may be the same or different. Suitable substituents include alkyl, aryl, nitro, cyano, —N($R^7$)($R^8$), halo, hydroxy, carboxy, alkenyl, alkynyl, cycloalkyl, heteroaryl, alkoxy, aryloxy, heteroaryloxy, alkoxycarbonyl, perfluoroalkyl, perfluoroalkoxy, arylalkyl, thioalkoxy, —S(O)$_2$—N(R')(R"), —C(=O)—N(R')(R"), (R')(R")N-alkyl, (R')(R")N-alkoxyalkyl, (R')(R")N-alkylaryloxyalkyl, —S(O)$_s$-aryl (where s=0-2) or —S(O)$_s$-heteroaryl (where s=0-2). Each R' and R" is independently an optionally substituted alkyl, cycloalkyl, or aryl group. R' and R", together with the nitrogen atom to which they are bound, can form a ring system in certain embodiments. Substituents may also be crosslinking groups.

The term "band gap" is intended to mean the energy difference between the highest occupied molecular orbital ("HOMO") and the lowest unoccupied molecular orbital ("LUMO") for a given material.

The term "charge transport," when referring to a layer, material, member, or structure is intended to mean such layer, material, member, or structure facilitates migration of such charge through the thickness of such layer, material, member, or structure with relative efficiency and small loss of charge. Hole transport materials facilitate positive charge; electron transport material facilitate negative charge. Although light-emitting materials may also have some charge transport properties, the term "charge transport layer, material, member, or structure" is not intended to include a layer, material, member, or structure whose primary function is light emission or light absorption.

The term "compound" is intended to mean an electrically uncharged substance made up of molecules that further include atoms, wherein the atoms cannot be separated from their corresponding molecules by physical means without breaking chemical bonds. The term is intended to include oligomers and polymers.

The term "crosslinkable group" or "crosslinking group" is intended to mean a group than can lead to crosslinking via thermal treatment or exposure to radiation. In some embodiments, the radiation is UV or visible.

The term "electroactive" as it refers to a layer or a material, is intended to indicate a layer or material which electronically facilitates the operation of the device. Examples of active materials include, but are not limited to, materials which conduct, inject, transport, or block a charge, where the charge can be either an electron or a hole, or materials which emit radiation or exhibit a change in concentration of electron-hole pairs when receiving radiation. Examples of inactive materials include, but are not limited to, planarization materials, insulating materials, and environmental barrier materials.

The prefix "fluoro" is intended to indicate that one or more hydrogens in a group has been replaced with fluorine.

The prefix "hetero" indicates that one or more carbon atoms has been replaced with a different atom. In some embodiments, the heteroatom is O, N, S, or combinations thereof.

The term "oxyalkyl" is intended to mean a heteroalkyl group having one or more carbons replaced with oxygens. The term includes groups which are linked via an oxygen.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. First Hole Transport Polymer

The first hole transport polymer is a crosslinkable polymer. The polymer has good processability and is capable of forming stable, defect-free films.

At least one of the monomers has a crosslinkable group, R', so that the polymer is crosslinkable. The polymer can be formed into a film and then crosslinked by exposure to heat and/or radiation to form a more robust, less soluble film. In some embodiments, the uncrosslinked polymer is soluble in solvents for film forming, and the crosslinked film is not soluble and thus is undisturbed by solvents used in later processing steps. The application of a soluble layer which can be converted into an insoluble film subsequent to deposition, can allow for the fabrication of multilayer solution-processed devices free of layer dissolution problems.

The number of crosslinking groups and the relative amount of monomers having crosslinking groups should be sufficient to allow for crosslinking the polymer when formed into a film. In some embodiments, the ratio of crosslinking monomer to non-crosslinking monomer is from about 1:20 to 20:1. In some embodiments, the ratio is from 1:20 to 1:3. In some embodiments, the ratio is from 1:10 to 1:4.

Examples of crosslinkable groups include, but are not limited to vinyl, acrylate, perfluorovinylether, 1-benzo-3,4-cyclobutane, siloxane, cyanate groups, cyclic ethers (epoxides), cycloalkenes, and acetylenic groups. In some embodiments, the crosslinkable group is vinyl.

In some embodiments, the first hole transport polymer is a crosslinkable triarylamine polymer. In some embodiments, the first hole transport polymer is a crosslinkable copolymer of a triarylamine derivative and a fluorene derivative.

In some embodiments, the first hole transport polymer is made from at least one first monomer selected from A1 through A5:

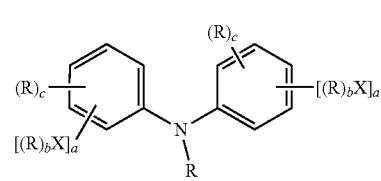

A1

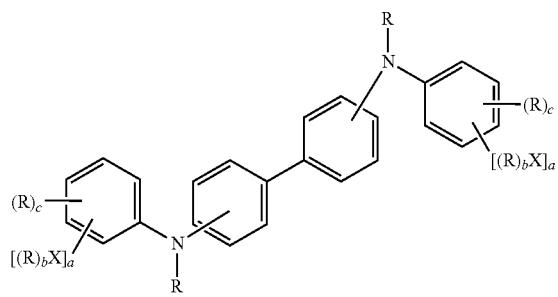
A2

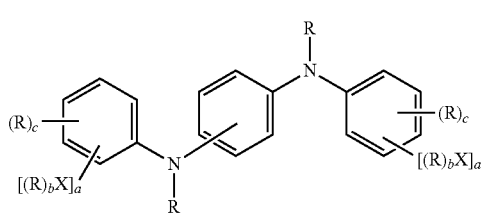
A3

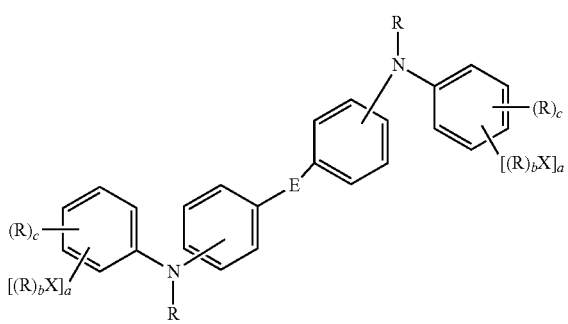
A4

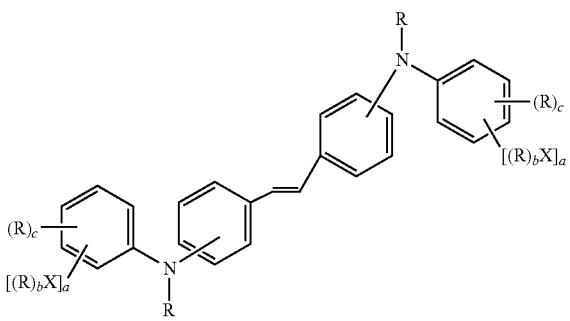
A5 where:
R is the same or different at each occurrence and is selected from the group consisting of H, D, alkyl, fluoroalkyl, aryl, fluoroaryl, alkoxy, aryloxy, $NR''_2$, R',

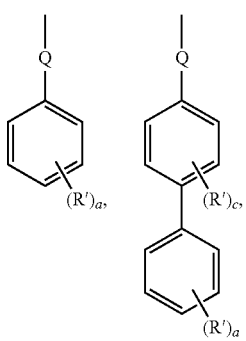

R' is a crosslinkable group;
R" is independently selected from the group consisting of H, alkyl, fluoroalkyl, aryl, fluoroaryl, and R';
X can be the same or different at each occurrence and is a leaving group;
Z is C, Si, or N;
E is the same or different at each occurrence and is $(ZR''_n)_b$, O, S, Se, or Te;
Q is the same or different at each occurrence and is $(ZR''_n)_b$;
a is an integer from 0 to 5;
b is an integer from 0 to 20;
c is an integer from 0 to 4;
q is an integer from 0 to 7; and
n is an integer from 1 to 2.

When the polymer is a homopolymer of one of A1 through A5, there must be at least one crosslinkable group. When the polymer is a copolymer of one of A1 through A5 with one or more additional monomers, at least one of the monomers must contain a crosslinkable group. The term "leaving group" is intended to mean a group that facilitates polymerization and is eliminated in the polymerization reaction. In one embodiment, the leaving group is a halide, boronic ester, boronic acid, or triflate, where triflate is trifluoromethanesulfonate.

In some embodiments, the first hole transport polymer is a copolymer of at least one monomer selected from A1 through A5 and at least one monomer selected from B1 through B6 or C1 through C6:

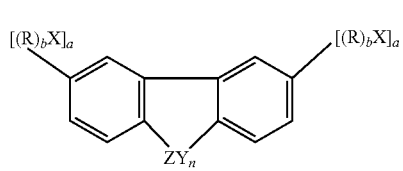
B1

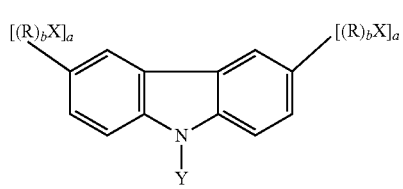
B2

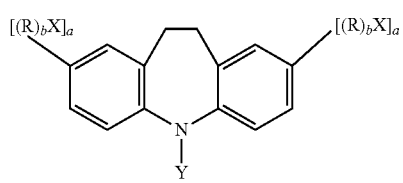
B3

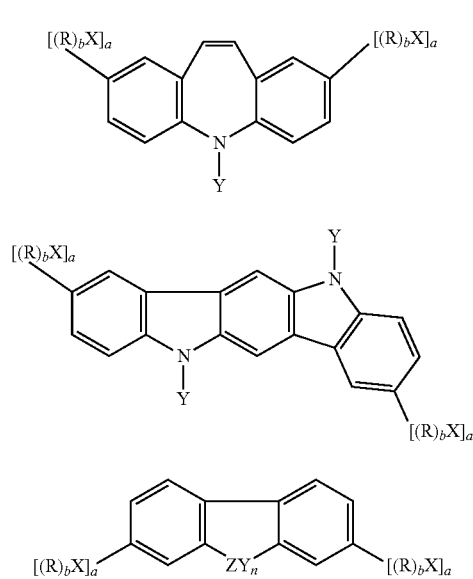

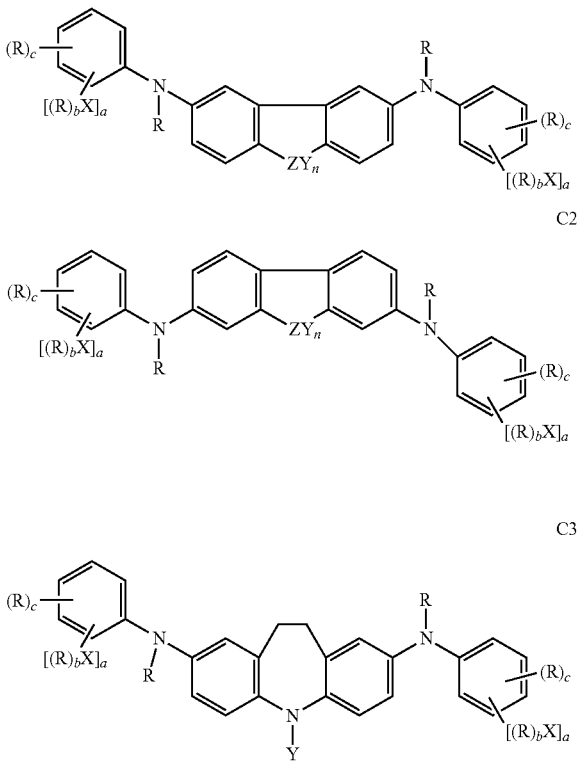

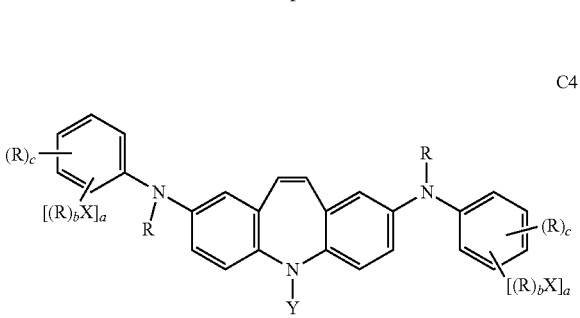

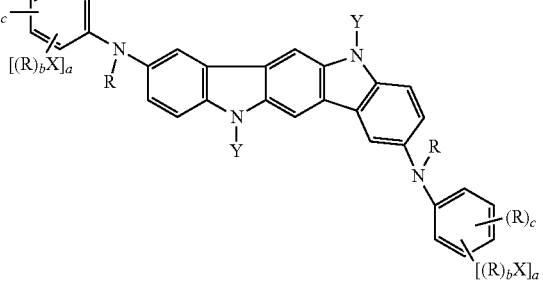

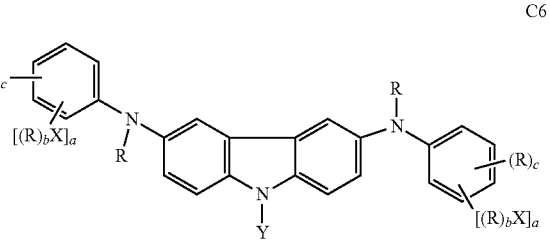

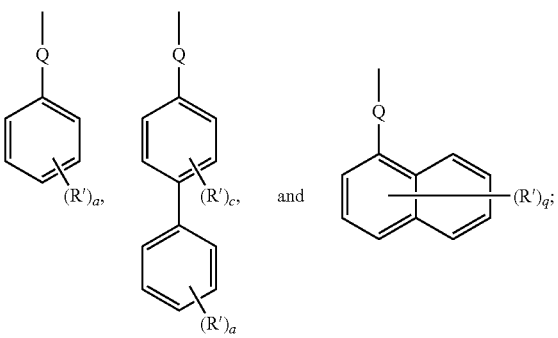

where:

R and Y are independently selected from the group consisting of H, D, alkyl, fluoroalkyl, aryl, fluoroaryl, alkoxy, aryloxy, NR"2, R', R' is a crosslinkable group;

R" is independently selected from the group consisting of H, alkyl, fluoroalkyl, aryl, fluoroaryl, and R';

X can be the same or different at each occurrence and is a leaving group;

Z is C, Si, or N;

E is the same or different at each occurrence and is $(ZR''_n)_b$, O, S, Se, or Te;

Q is the same or different at each occurrence and is $(ZR''_n)_b$;

a is an integer from 0 to 5;

b is an integer from 0 to 20;

c is an integer from 0 to 4;

q is an integer from 0 to 7; and n is an integer from 1 to 2;

with the proviso that at least one of the monomers contains a crosslinkable group.

In some embodiments, the first hole transport polymer is selected from the group consisting of P1 through P32:
P1:
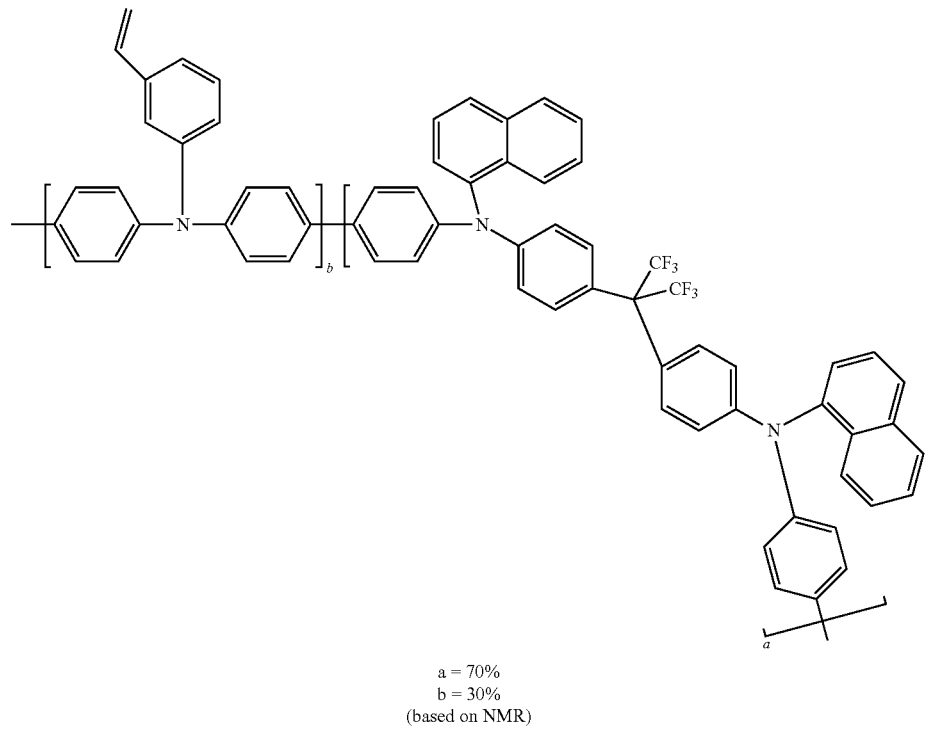
a = 70%
b = 30%
(based on NMR)
P2:
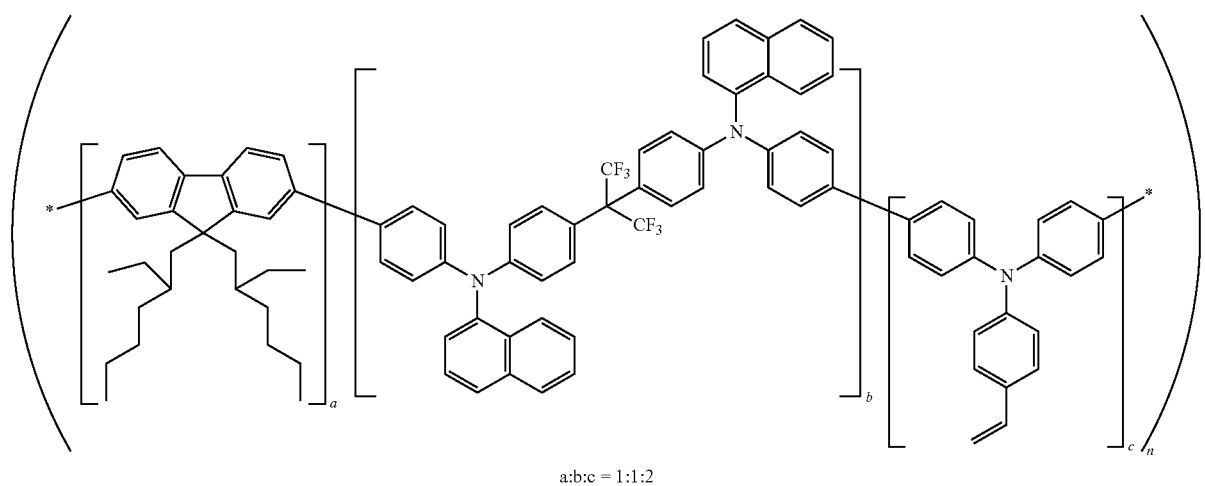
a:b:c = 1:1:2

-continued
P3:
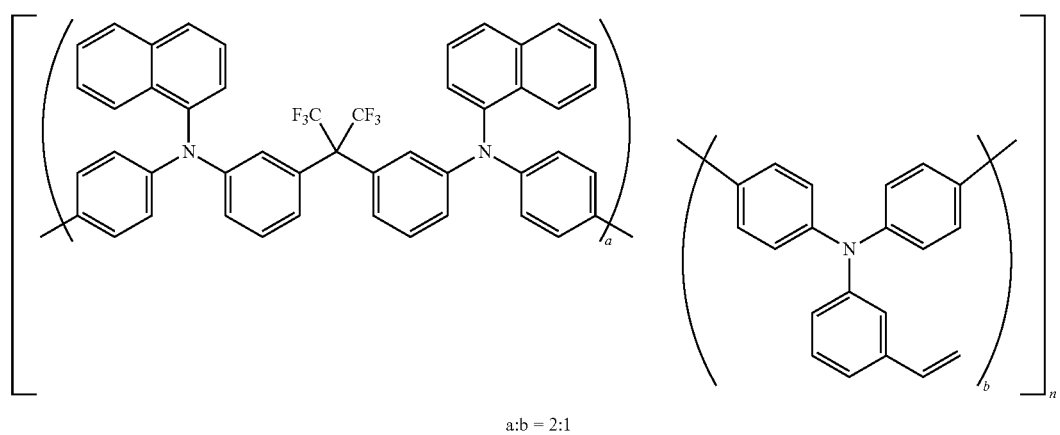
a:b = 2:1
P4:
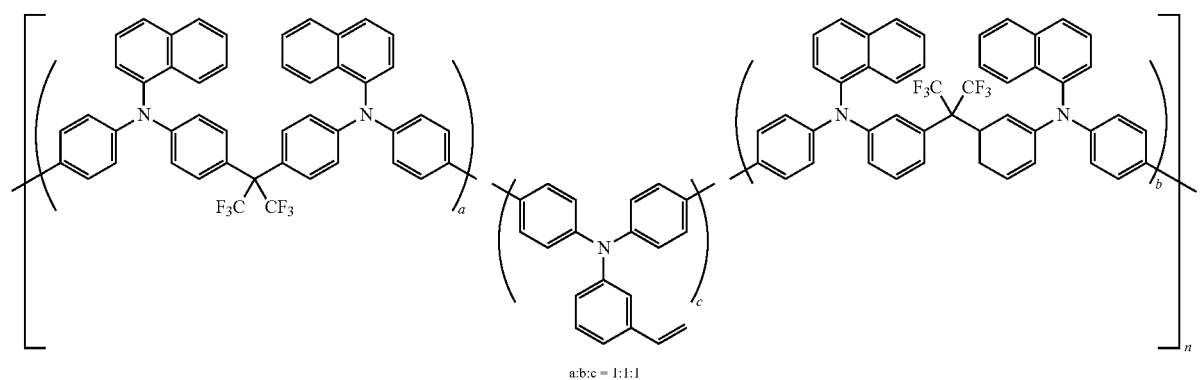
a:b:c = 1:1:1
P5:
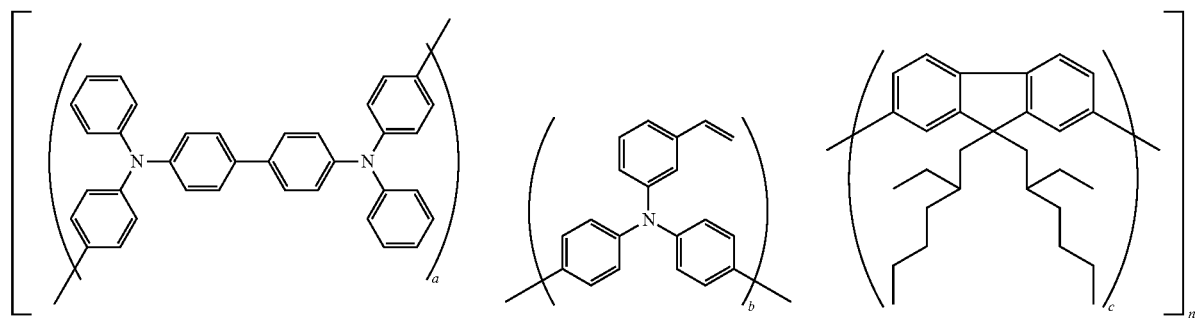
a:b:c = 1:2:2
P6:
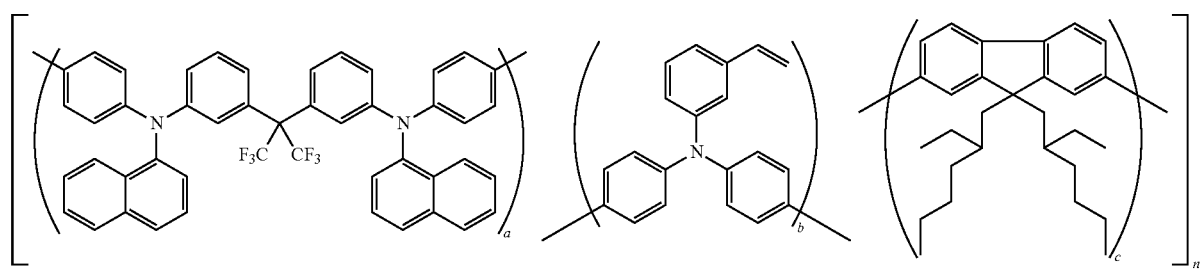
a:b:c = 5:3:2

-continued
P7:
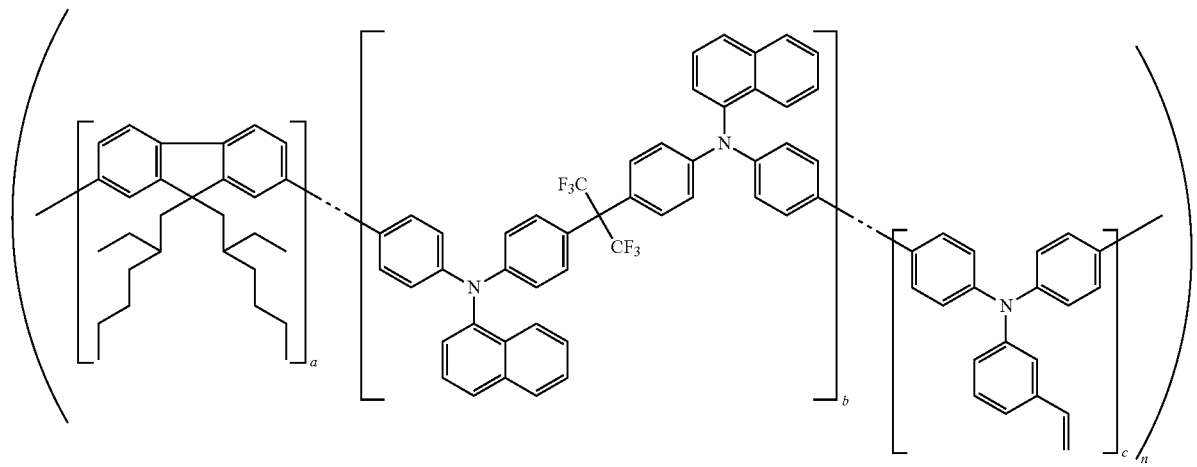
a:b:c = 1:1:2
P8:
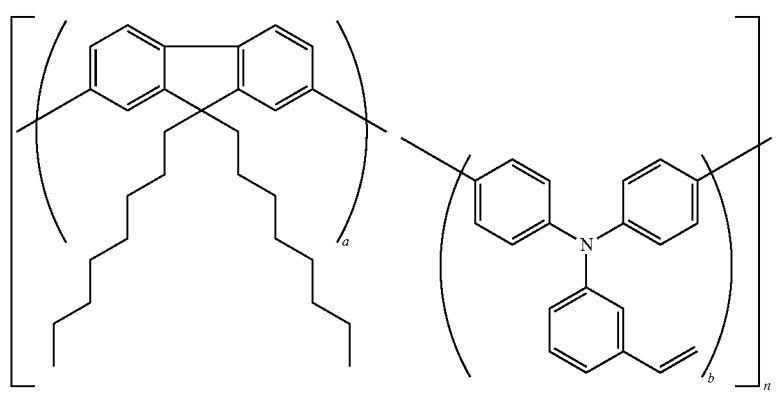
a:b = 75:25
P9:
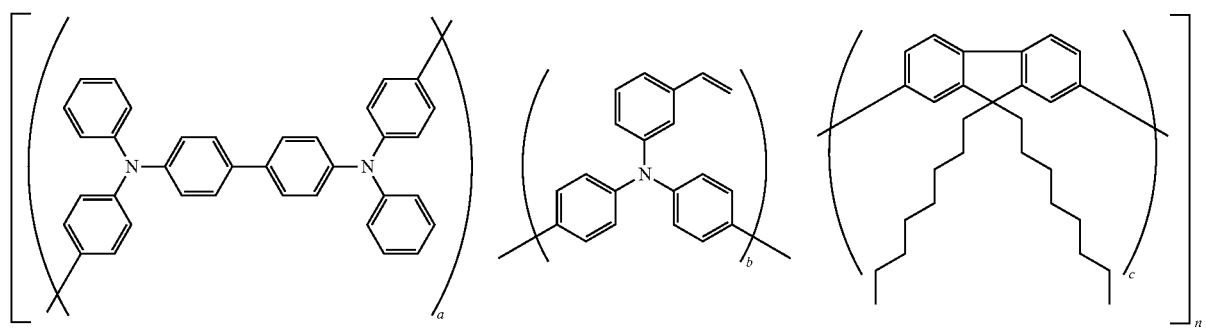
a:b:c: = 1:2:7

-continued
P10:
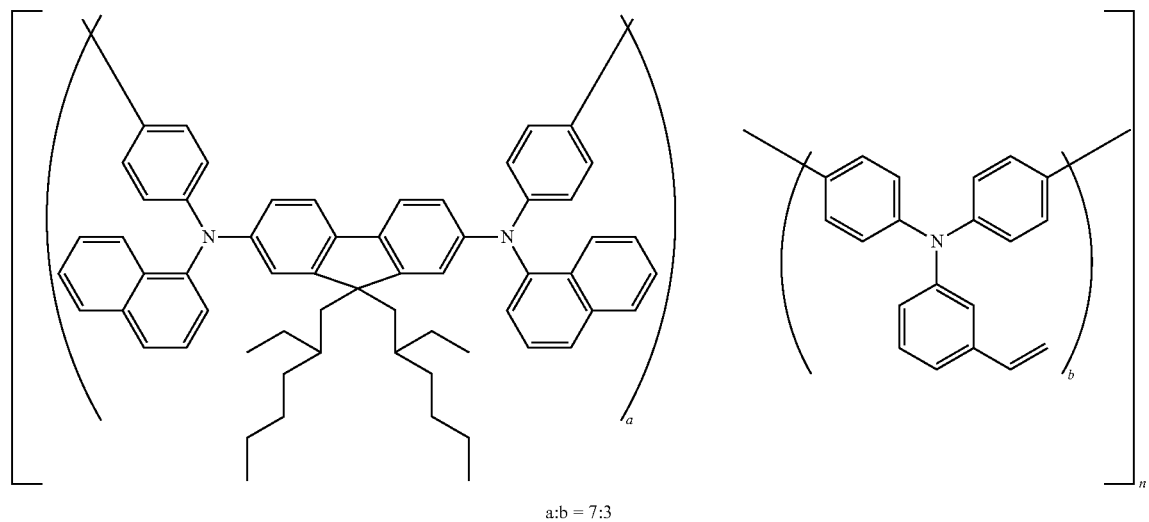
a:b = 7:3
P11:
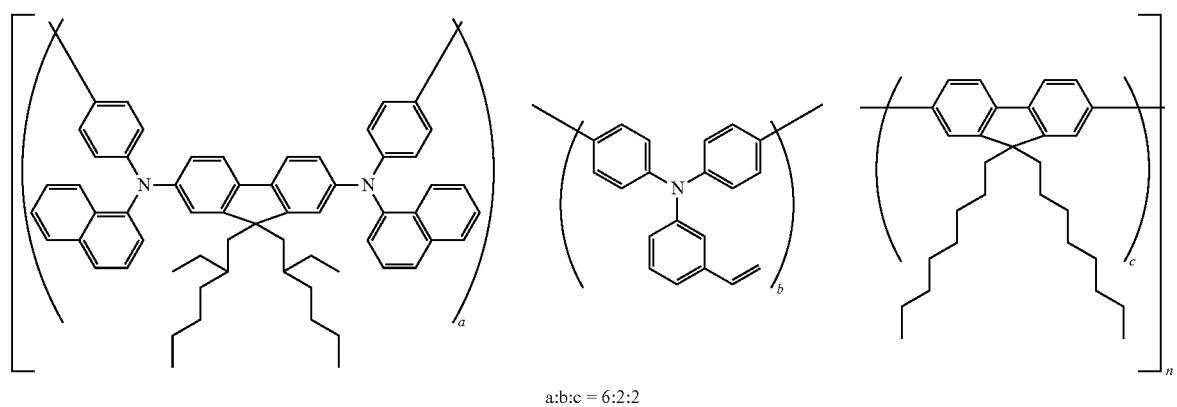
a:b:c = 6:2:2
P12:
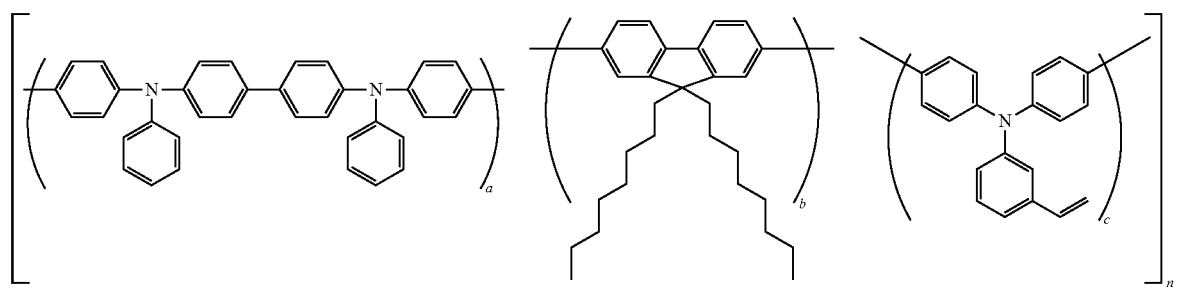
a:b:c = 2:2:1

P13:
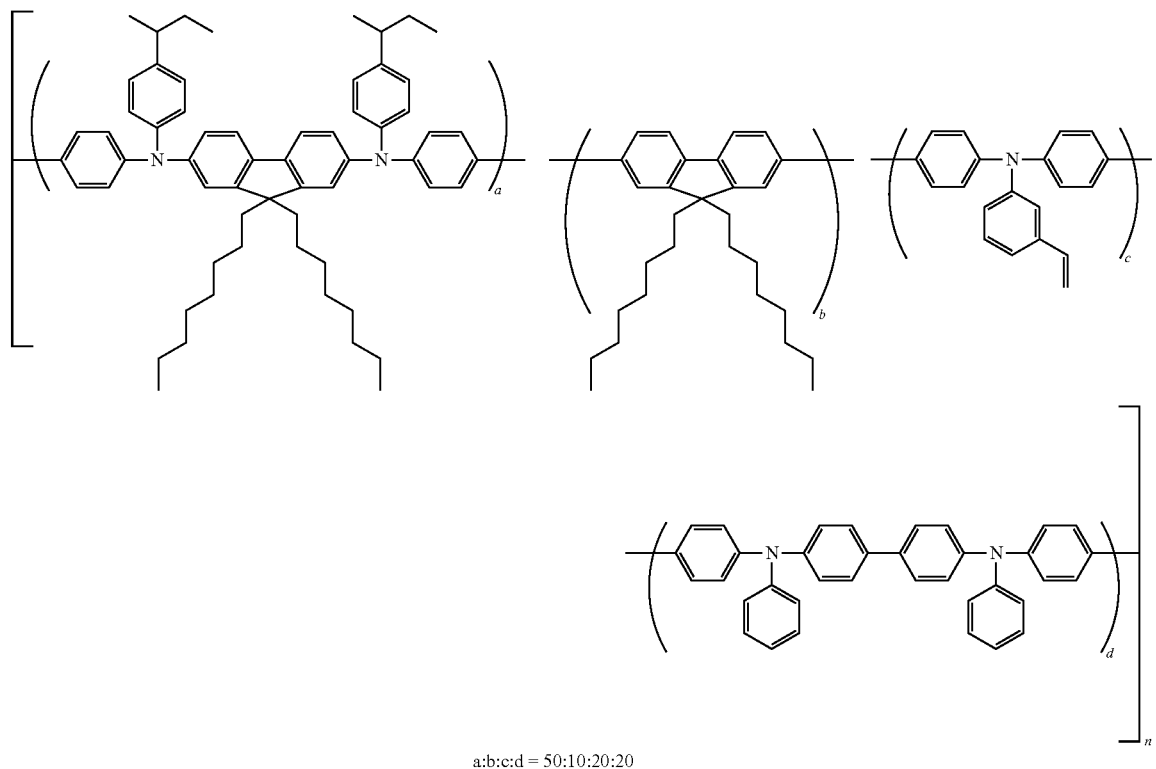
a:b:c:d = 50:10:20:20
P14:
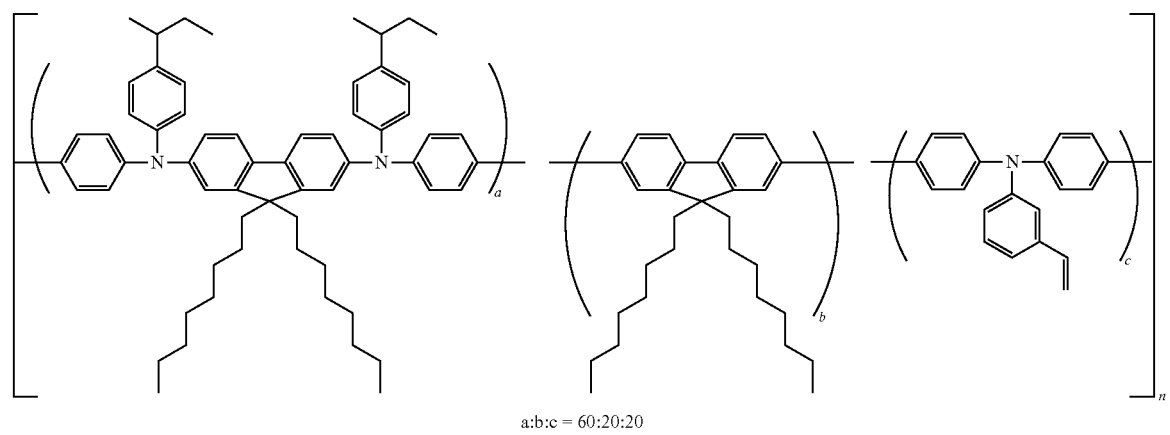
a:b:c = 60:20:20
P15:
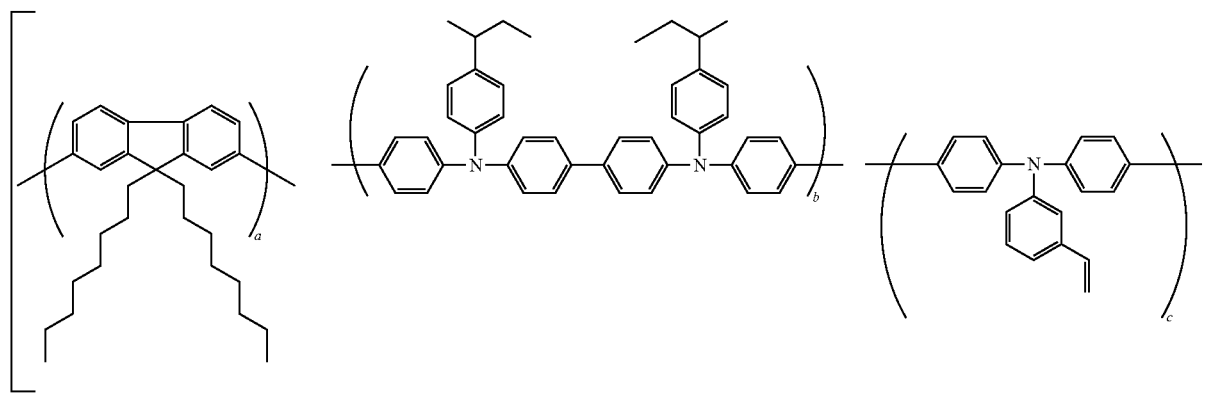

-continued
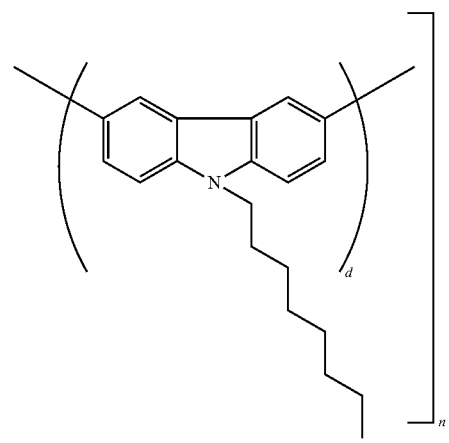
P16:
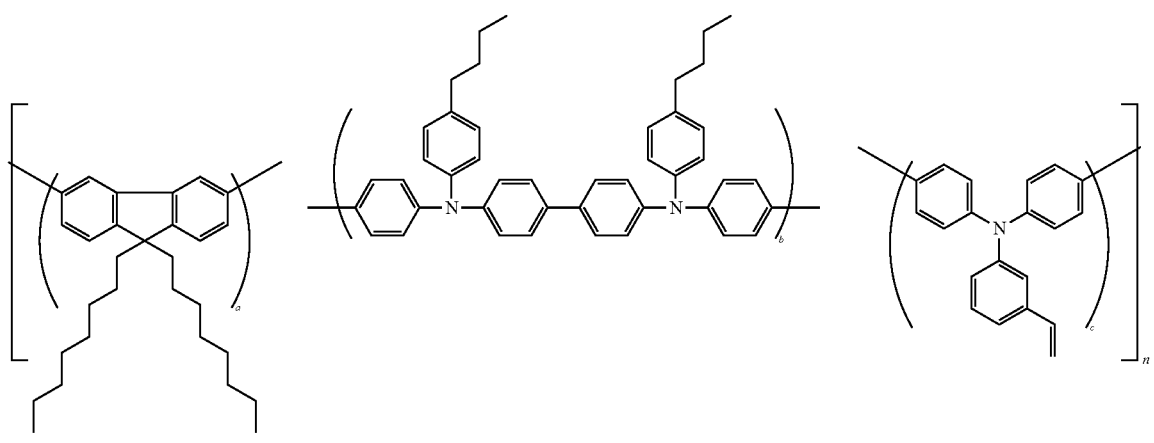
a:b:c = 2:2:1
P17:
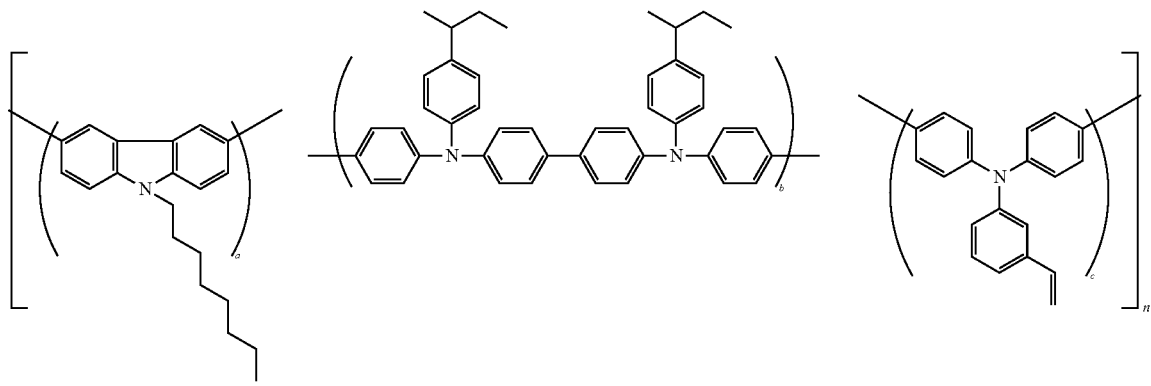
a:b:c = 2:2:1

P18:
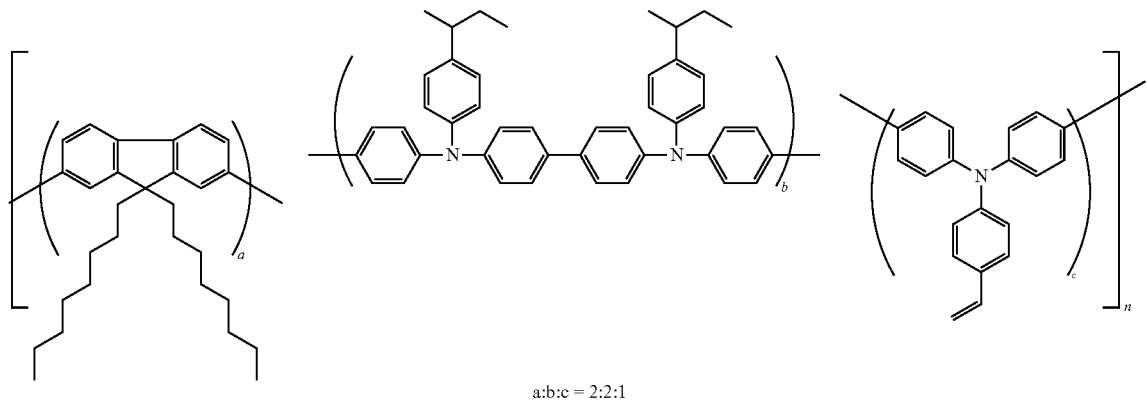
a:b:c = 2:2:1
P19:
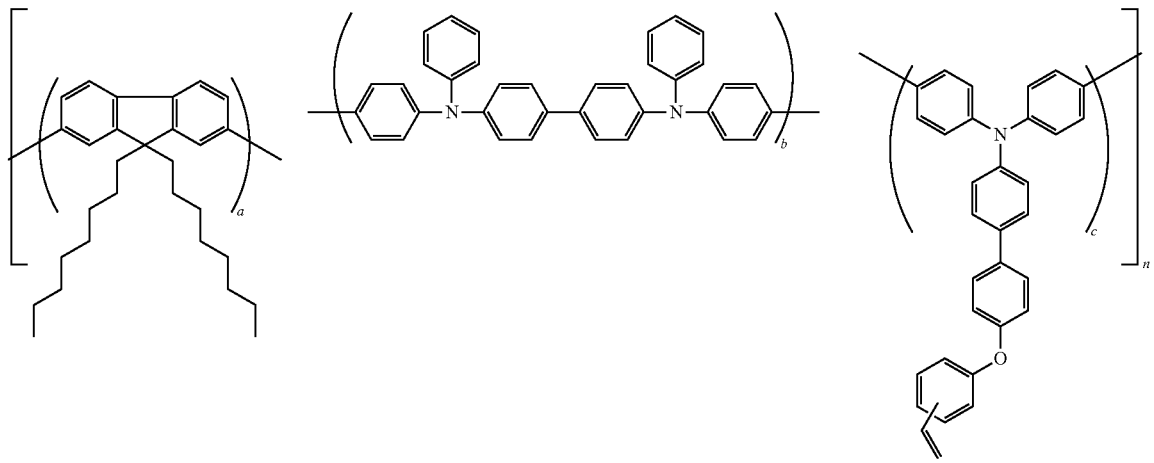
a:b:c = 2:2:1
P20:
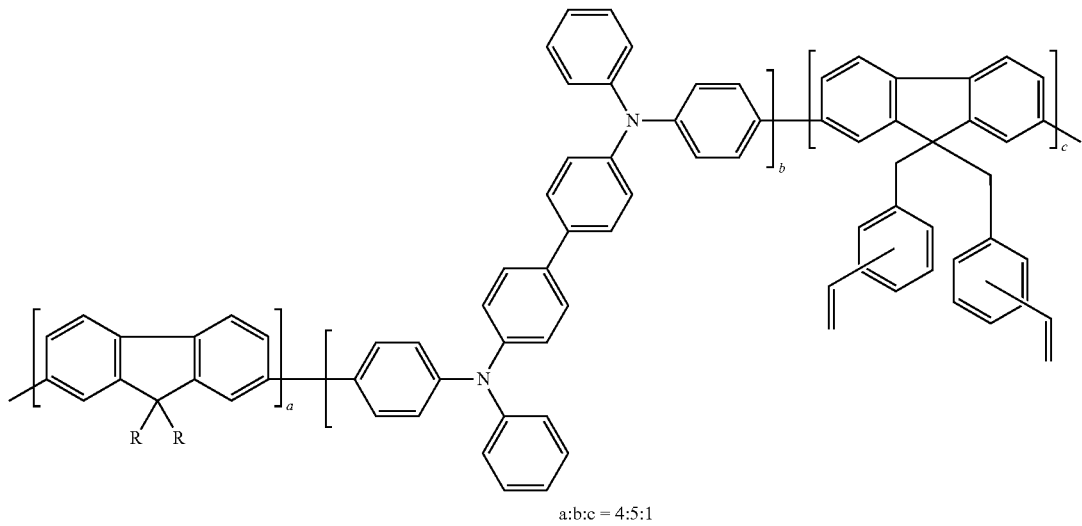
a:b:c = 4:5:1

-continued
P21:
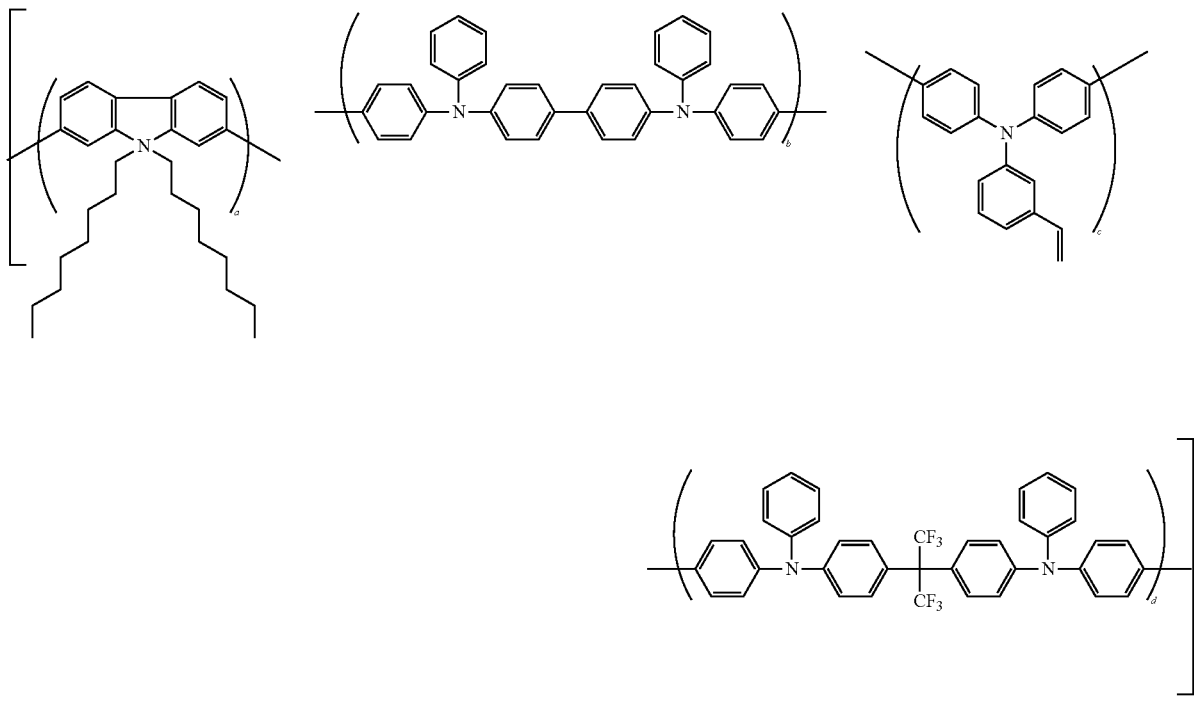
a:b:c = 39:40:20:1
P22:
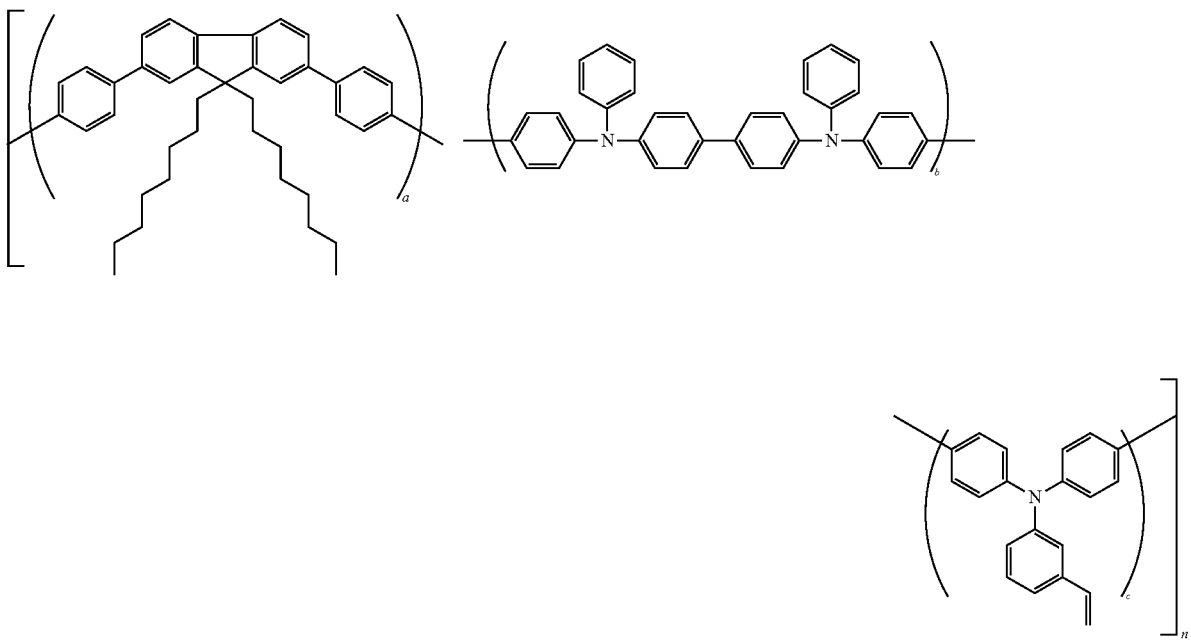
a:b:c = 2:2:1

P23:
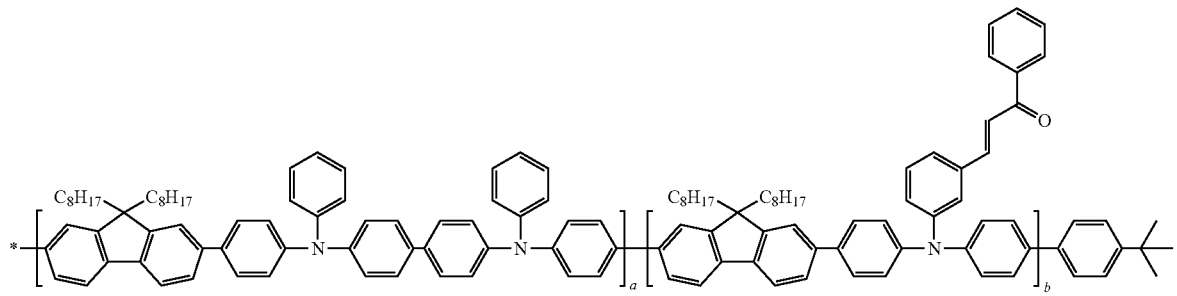
a:b = 0.6:0.4 molar ratio
P24:
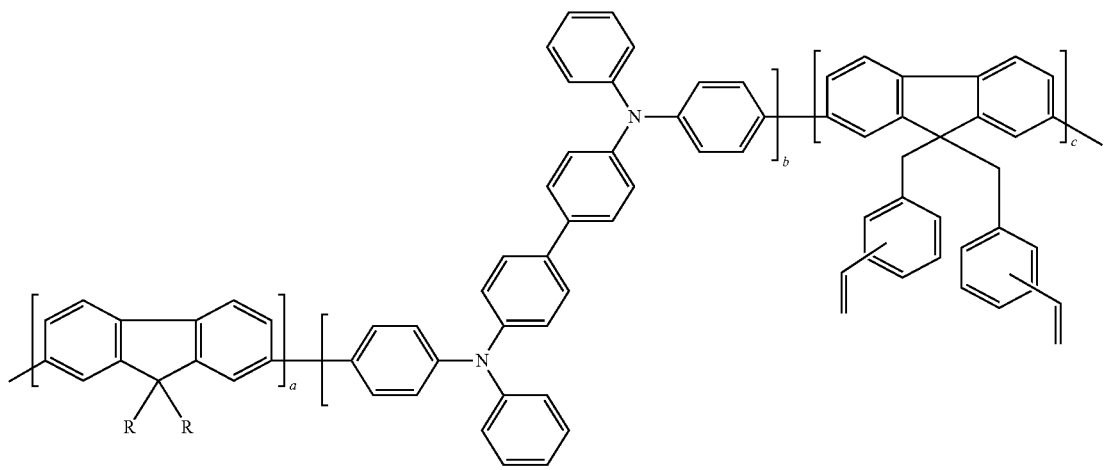
a:b:c = 3:5:2
P25:
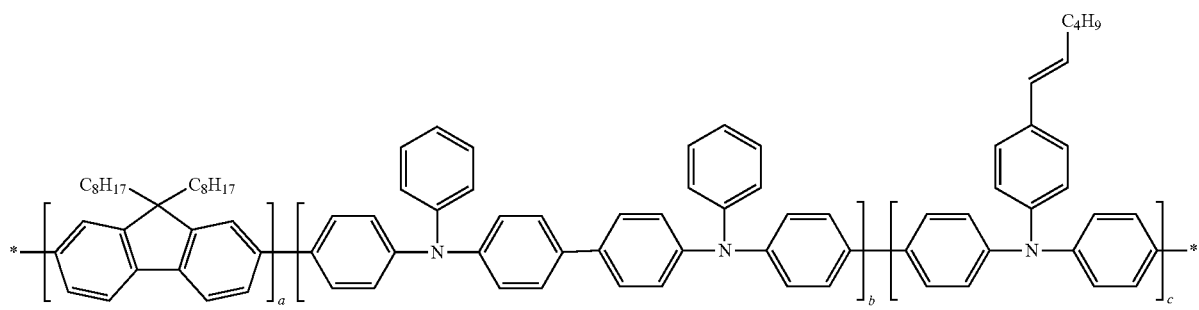
0.5:0.3:0.2 (a:b:c) and monomer C is 85:15 trans:cis.

P26:
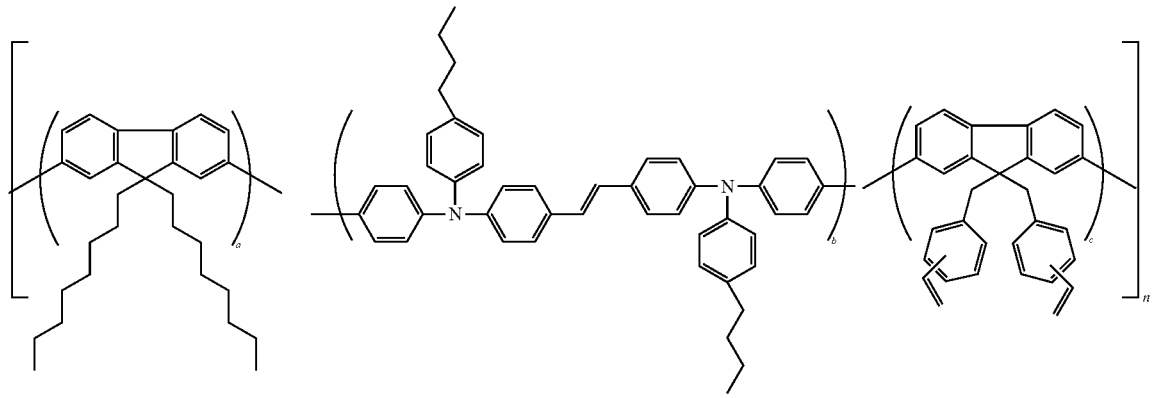
a:b:c = 4:5:1
P27:
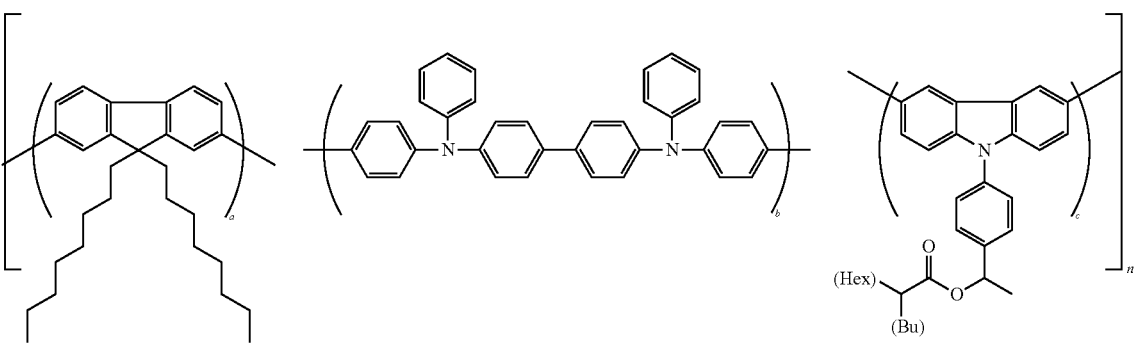
a:b:c = 4:5:1
P28:
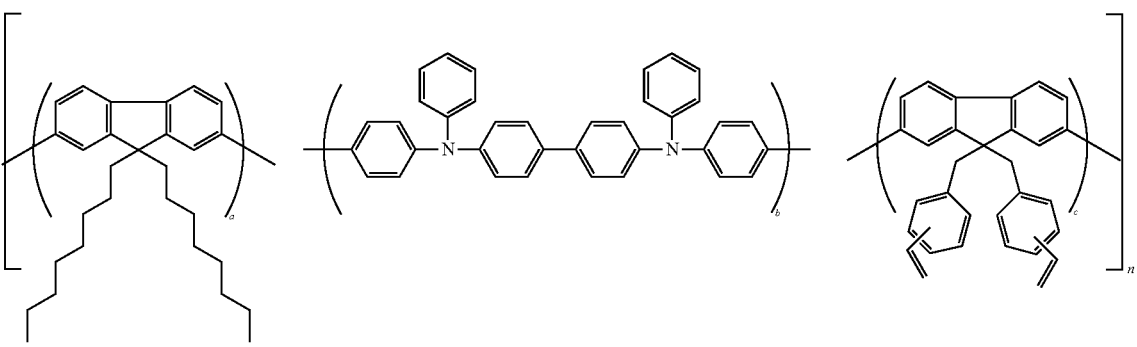
a:b:c = 35:50:15

-continued
P29:
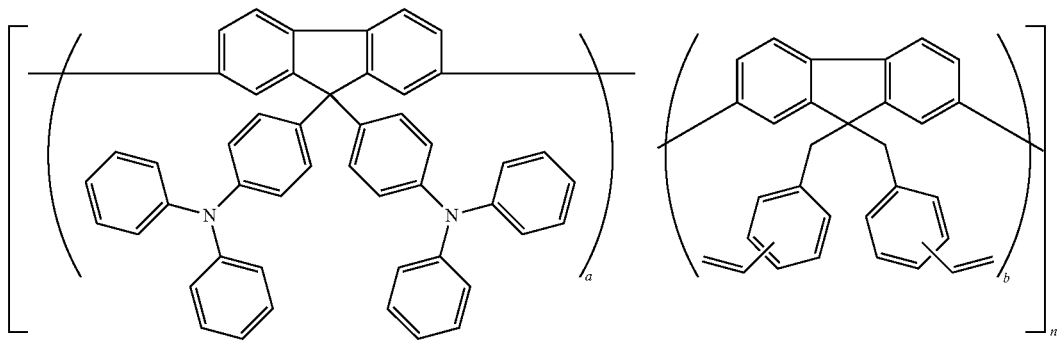
a:b = 85:15
P30:
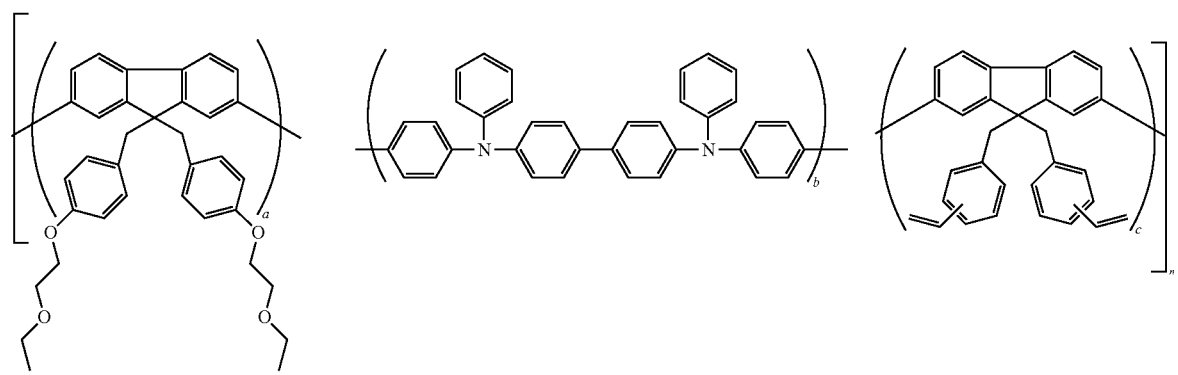
a:b:c = 4:5:1
P31:
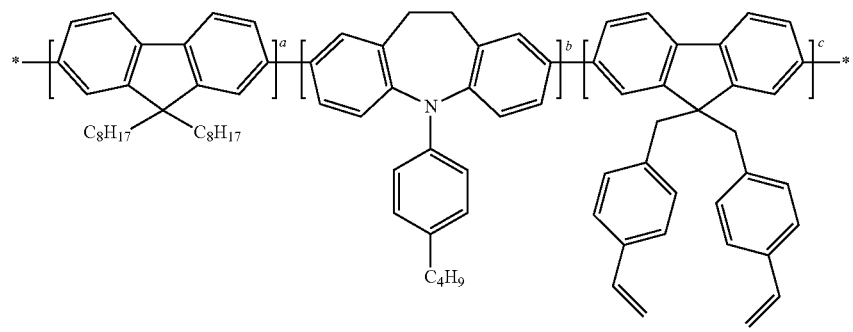
a:b:c = 0.5:0.4:0.1 molar ratio
P32:
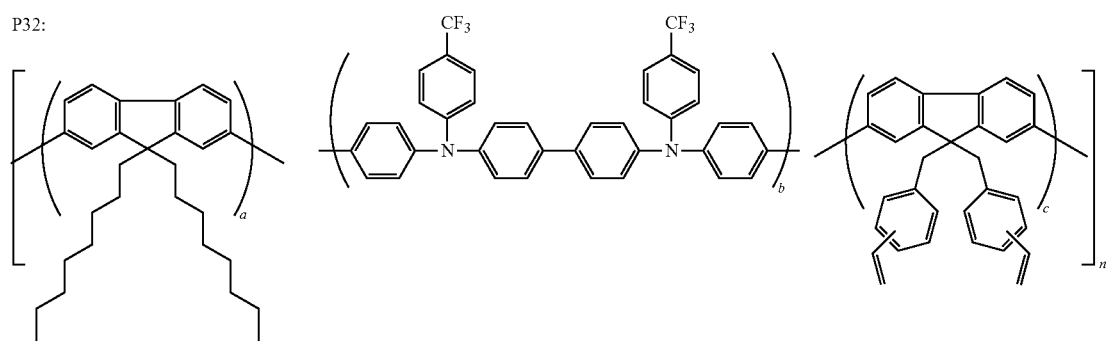
a:b:c = 3:5:2

In some embodiments, the first hole transport polymer is a polymer made from a monomer having Formula I:

Formula I

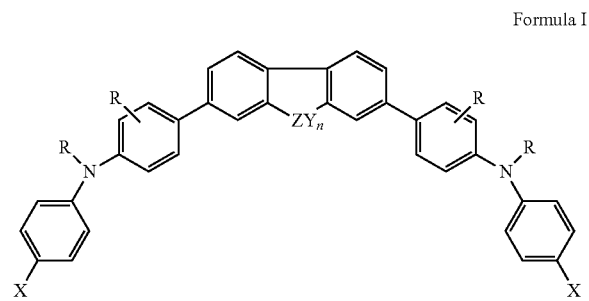

where:
R and Y are independently selected from the group consisting of H,
D, alkyl, fluoroalkyl, aryl, fluoroaryl, alkoxy, aryloxy, NR"$_2$, R',

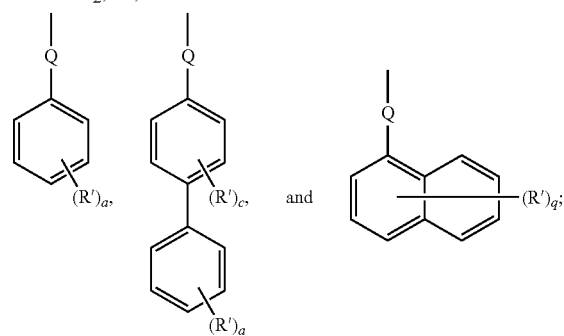

R' is a crosslinkable group;
R" is independently selected from the group consisting of H, alkyl, fluoroalkyl, aryl, fluoroaryl, and R';
X can be the same or different at each occurrence and is a leaving group;
Z is the same or different at each occurrence and is C, Si, or N;
Q is the same or different at each occurrence and is (ZR"$_n$)$_b$;
a is an integer from 0 to 5;
b is an integer from 0 to 20;
c is an integer from 0 to 4;
q is an integer from 0 to 7; and
n is an integer from 1 to 2.

When the polymer is a homopolymer of a monomer of Formula I, there must be at least one crosslinkable group. When the polymer is a copolymer of a monomer of Formula I with one or more additional monomers, at least one of the monomers must contain a crosslinkable group.

In some embodiments, the hole transport polymer is a copolymer made from a monomer having Formula I and at least one comonomer selected from the group consisting of Formulae II through VIII:

Formula II

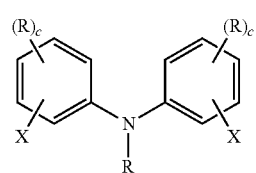

-continued

Formula III

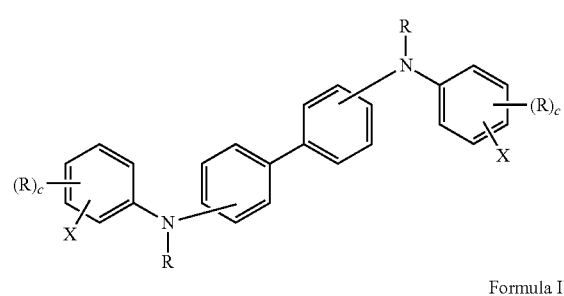

Formula IV

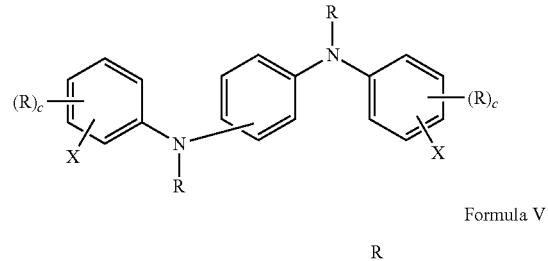

Formula V

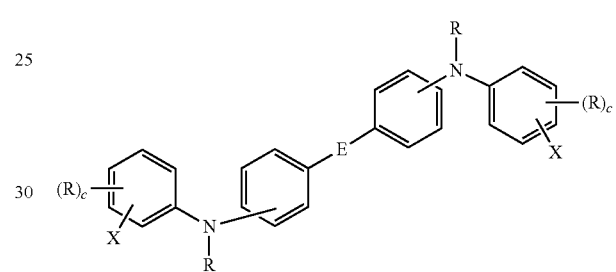

Formula VI

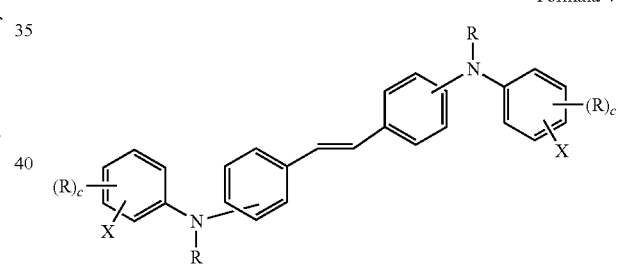

Formula VII

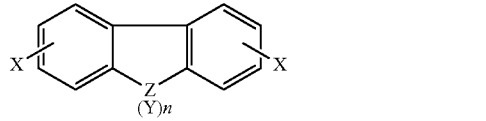

Formula VIII

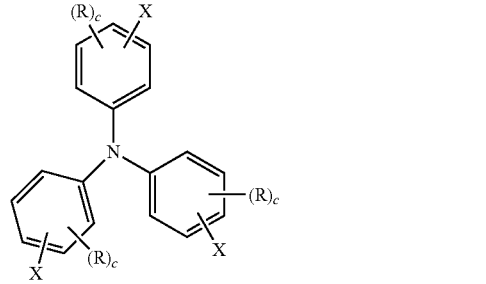

where:
R and Y are independently selected from the group consisting of H, D, alkyl, fluoroalkyl, aryl, fluoroaryl, alkoxy, aryloxy, NR"$_2$, R',

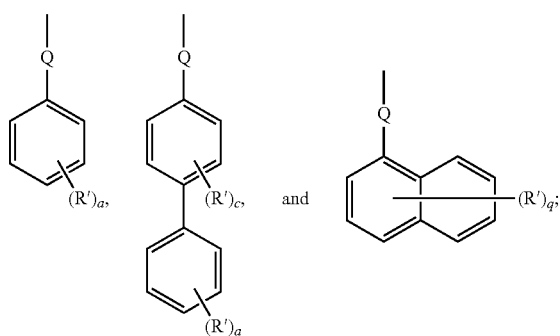

R' is a crosslinkable group;
R" is independently selected from the group consisting of H, alkyl, fluoroalkyl, aryl, fluoroaryl, and R';
Q is the same or different at each occurrence and is $(ZR''_n)_b$;
X can be the same or different at each occurrence and is a leaving group;
Z is the same or different at each occurrence and is C, Si, or N;
E is the same or different at each occurrence and is $(ZR''_n)_b$, O, S, Se, or Te;
a is an integer from 0 to 5;
b is an integer from 0 to 20;
c is an integer from 0 to 4;
q is an integer from 0 to 7, and
n is an integer from 1 to 2,
with the proviso that there is at least one crosslinking group.

In one embodiment, the copolymer has a formula selected from P33 and P34

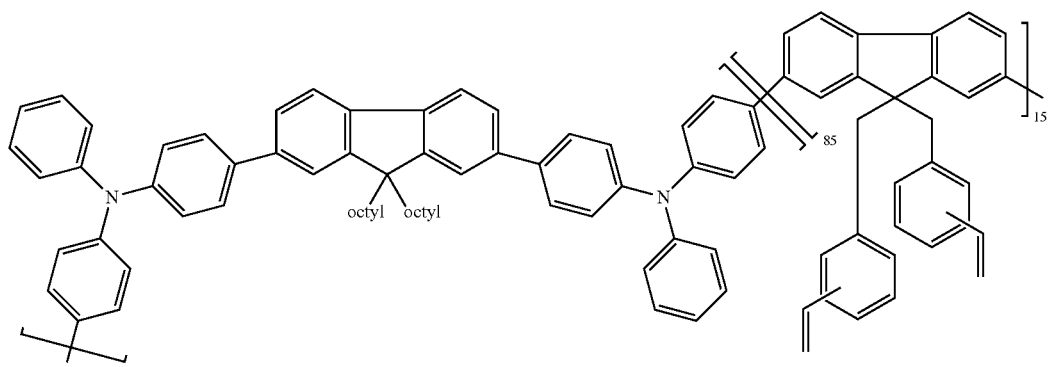

P33:

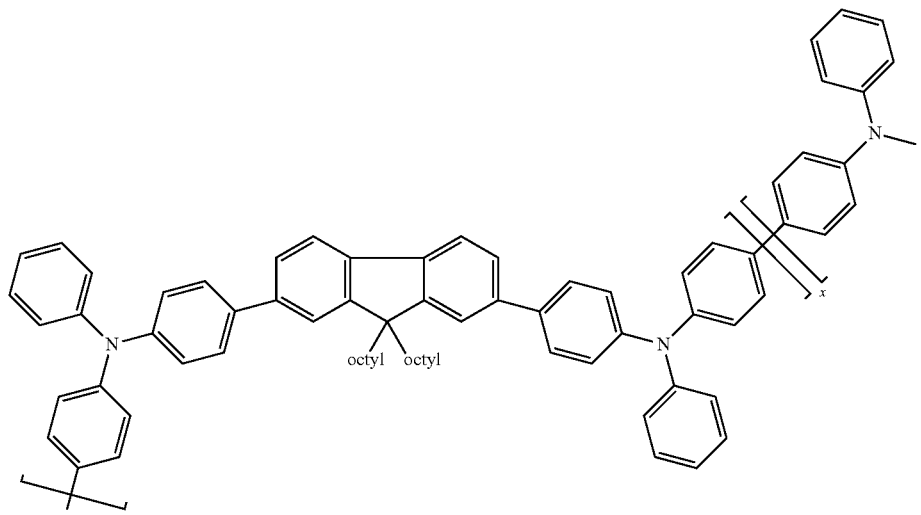

P34:

-continued

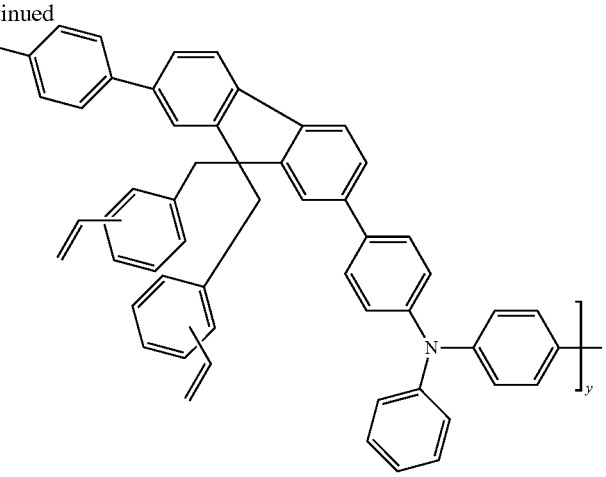

where x is 0.8 to 0.9, and y is 0.2 to 0.1.

These polymers can generally be prepared by three known synthetic routes. In a first synthetic method, as described in Yamamoto, Progress in Polymer Science, Vol. 17, p 1153 (1992), the dihalo derivatives of the monomeric units are reacted with a stoichiometric amount of a zerovalent nickel compound, such as bis(1,5-cyclooctadiene)nickel(0). In the second method, as described in Colon et al., Journal of Polymer Science, Part A, Polymer chemistry Edition, Vol. 28, p. 367 (1990). The dihalo derivatives of the monomeric units are reacted with catalytic amounts of Ni(II) compounds in the presence of stoichiometric amounts of a material capable of reducing the divalent nickel ion to zerovalent nickel. Suitable materials include zinc, magnesium, calcium and lithium. In the third synthetic method, as described in U.S. Pat. No. 5,962,631, and published PCT application WO 00/53565, a dihalo derivative of one monomeric unit is reacted with a derivative of another monomeric unit having two reactive groups selected from boronic acid, boronic acid esters, and boranes, in the presence of a zerovalent palladium catalyst, such as tetrakis(triphenylphosphine)Pd.

3. Second Hole Transport Polymer

The second hole transport polymer has substantially no crosslinkable groups. By "substantially no crosslinkable groups", it is meant that, if present, such groups are in such a small concentration that the polymer is not crosslinkable to any detectable extent.

In some embodiments, the second hole transport polymer is a triarylamine polymer. In some embodiments, the polymer is a copolymer of a triarylamine derivative and a fluorene derivative. In some embodiments, the second hole transport polymer has a formula similar to those discussed above for the first hole transport polymer, but without any crosslinkable monomers.

Some non-limiting examples of such polymers include P35 to P37 below:

P35:

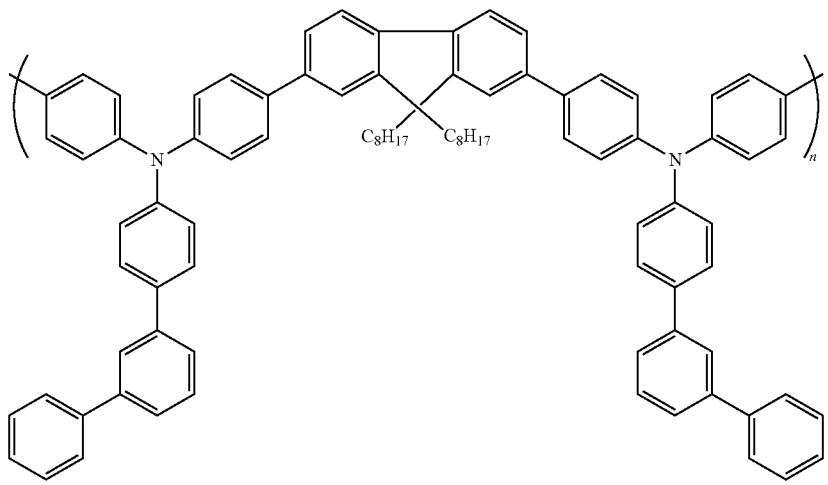

P36:

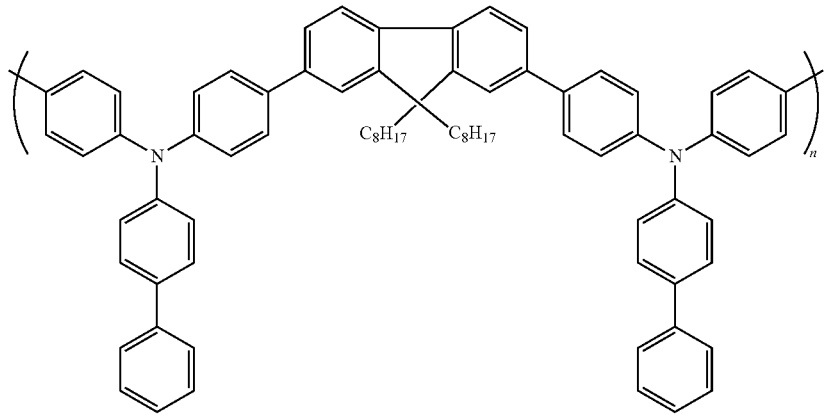

P37:

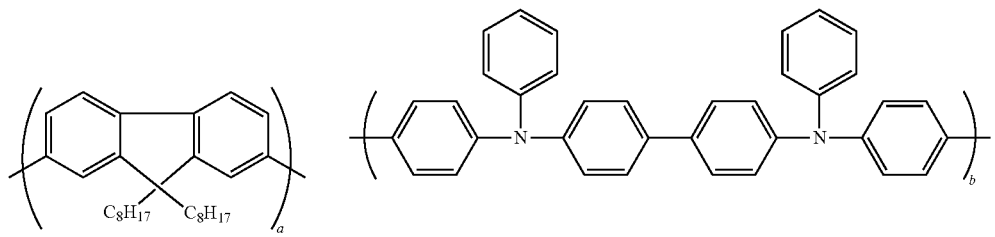

a:b = 1:1

In some embodiments, the second hole transport polymer has a larger band gap than that of the first hole transport polymer.

In some embodiments, the second hole transport polymer has Formula IX or Formula X:

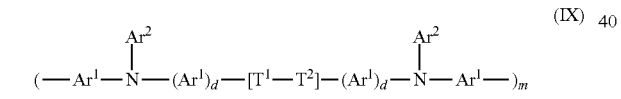

wherein:

Ar$^1$ is the same or different at each occurrence and is selected from the group consisting of phenylene and naphthylene;

Ar$^2$ is the same or different at each occurrence and is an aryl group;

M is the same or different at each occurrence and is a conjugated moiety;

T$^1$ and T$^2$ are independently the same or different at each occurrence and are conjugated moieties which are connected in a non-planar configuration;

d is an integer from 0 to 6;

e, f, and g are mole fractions such that e+f+g=1.0, with the proviso that f is not zero, and at least one of e and g is not zero, and when e is zero, M comprises at least two triarylamine units; and m is an integer greater than 5.

The term "non-planar configuration" as it refers to [T$^1$-T$^2$] in the above formulae, is intended to mean that the immediately adjacent groups in T$^1$ and T$^2$ are not oriented in the same plane.

Any of the aromatic rings in Formulae IX and X may be substituted at any position. The substituents may be present to improve one or more physical properties of the compound, such as solubility. The polymer is not crosslinkable.

The T$^1$-T$^2$ group introduces non-planarity into the backbone of the compound. The moiety in T$^1$ that is directly linked to a moiety in T$^2$ is linked such that the T$^1$ moiety is oriented in a plane that is different from the moiety in T$^2$ to which it is linked. Although other parts of the T$^1$ unit, for example, substituents, may lie in one or more different planes, it is the plane of the linking moiety in T$^1$ and the linking moiety in T$^2$ in the compound backbone that provide the non-planarity. Because of the non-planar T$^1$-T$^2$ linkage, the compounds are chiral. In general, they are formed as racemic mixtures. The non-planarity can be viewed as the restriction to free rotation about the T$^1$-T$^2$ bond. Rotation about that bond leads to racemization. The half-life of racemization for T$^1$-T$^2$ is greater than that for an unsubstituted biphenyl. In some embodiments, the half-life of racemization is 12 hours or greater at 20° C.

T$^1$ and T$^2$ are conjugated moieties. In some embodiments, T$^1$ and T$^2$ are aromatic moieties. In some embodiments, T$^1$ and T$^2$ are selected from the group consisting of phenylene, napthylene, and anthracenyl groups.

In some embodiments, [T$^1$-T$^2$] is a substituted biphenylene group. The term "biphenylene" is intended to mean a biphenyl group having two points of attachment to the compound backbone. The term "biphenyl" is intended to mean a group having two phenyl units joined by a single bond. The biphenylene group can be attached at one of the 3-, 4-, or 5-positions and one of the 3'-, 4'-, or 5'-positions. The substituted biphenylene group has at least one substituent in the 2-position. In some embodiments, the biphenylene group has substituents in at least the 2- and 2'-positions.

In some embodiments, [T¹-T²] is a binaphthylene group. The term "binaphthylene" is intended to mean a binapthyl group having 2 points of attachment to the polymer backbone. The term "binaphthyl" is intended to mean a group having two naphthalene units joined by a single bond.

In some embodiments, [T¹-T²] is a binaphthylene group. The term "binaphthylene" is intended to mean a binapthyl group having 2 points of attachment to the polymer backbone. The term "binaphthyl" is intended to mean a group having two naphthalene units joined by a single bond. In some embodiments, the binaphthylene group is a 1,1'-binaphthylene, which is attached to the polymer backbone at one of the 3-, 4-, 5-, 6, or 7-positions and one of the 3'-, 4'-, 5'-, 6', or 7'-positions. This is illustrated below, where the dashed lines represent possible points of attachment.

1,1'-binaphthylene

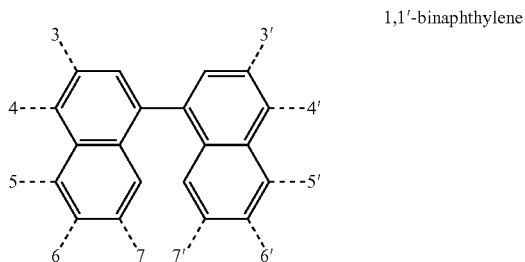

In some embodiments, the binaphthylene group is a 1,2'-binaphthylene having at least one substituent at the 8- or 9'-position, and which is attached to the polymer backbone at one of the 3-, 4-, 5-, 6, or 7-positions and one of the 4'-, 5'-, 6'-, 7', or 8'-positions. This is illustrated below, where the dashed lines represent possible points of attachment and at least one R² represents a substituent.

1,2'-binaphthylene

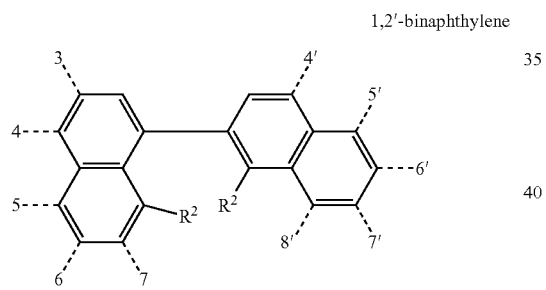

In some embodiments, the binaphthylene group is a 2,2'-binaphthylene having at least one substituent at the 8- or 9'-position, and which is attached to the polymer backbone at one of the 4-, 5-, 6-, 7, or 8-positions and one of the 4'-, 5'-, 6'-, 7', or 8'-positions. This is illustrated below, where the dashed lines represent possible points of attachment and at least one R² represents a substituent.

2,2'-binaphthylene

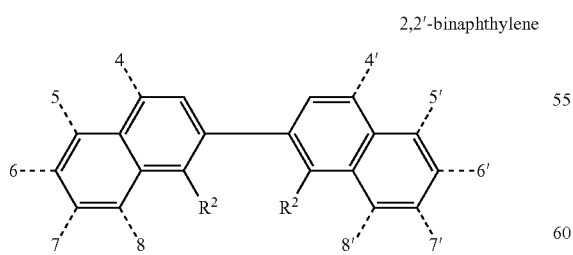

In some embodiments, [T¹-T²] is a phenylene-naphthylene group. In some embodiments, [T¹-T²] is a phenylene-1-naphthylene group, which is attached to the polymer backbone at one of the 3-, 4-, or 5-positions in the phenylene and one of the 3-, 4-, or 5-positions of the naphthylene. In some embodiments, [T¹-T²] is a phenylene-2-naphthylene group, which is attached to the polymer backbone at one of the 3-, 4-, or 5-positions in the phenylene and one of the 6-, 6-, 7-, or 8-positions of the naphthylene.

In some embodiments, the biphenylene, binaphthylene, and phenylene-naphthylene groups are substituted at one or more positions.

In some embodiments, [T¹-T²] is selected from one of the following:

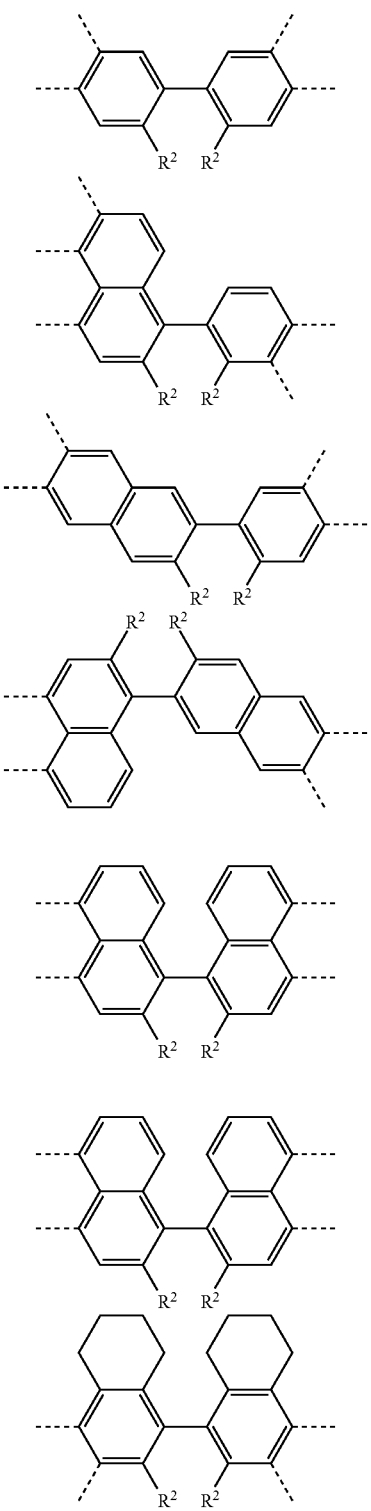

-continued

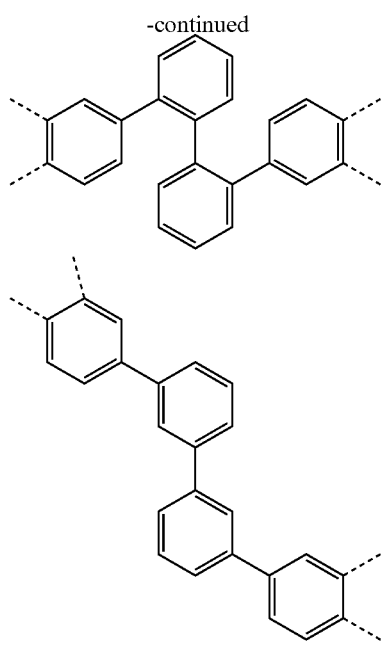

where $R^2$ is the same or different and is selected from the group consisting of alkyl, aryl, alkoxy, aryloxy, fluoroalkyl, fluoroaryl, fluoroaryloxy fluoroalkyloxy, oxyalkyl, and alkenyl groups. The dashed line represents a possible point of attachment to the polymer backbone. In some embodiments, $R^2$ is a C1-10 alkyl or alkoxy; in some embodiments, a C3-8 branched alkyl or alkoxy. In some embodiments, the two $R^2$ groups are joined together to form a non-aromatic ring.

In some embodiments, d is 1-3. In some embodiments d is 1-2. In some embodiments, d is 1.

Formula X represents a copolymer in which there is at least one $T^1$-$T^2$ group and at least one other conjugated moiety. In some embodiments, f is at least 0.4. In some embodiments, f is in the range of 0.4 to 0.6. The copolymers can be random, alternating, or block copolymers. In some embodiments, M comprises triarylamine units. In some embodiments, M is an aromatic group.

Some non-limiting examples of polymers having Formula IX include P38 through P49 below.

P38:

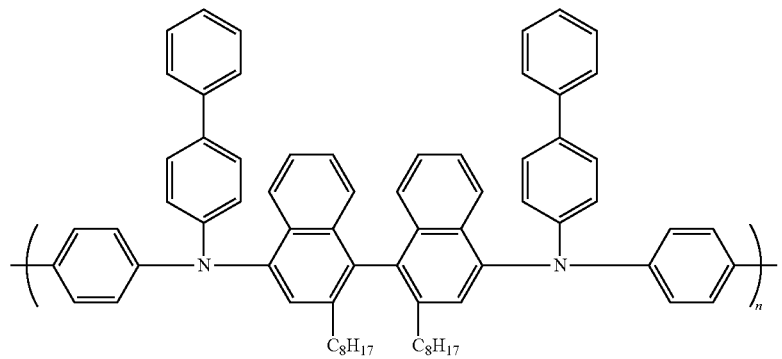

P39

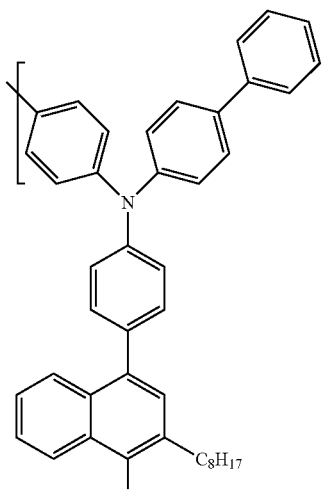

-continued
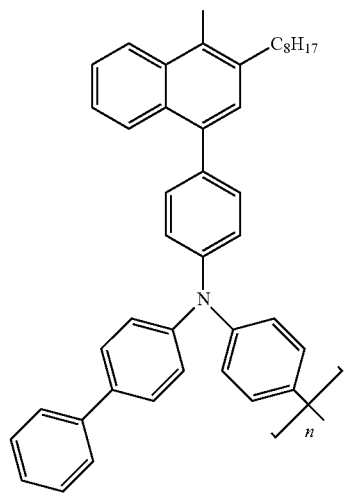
P40:
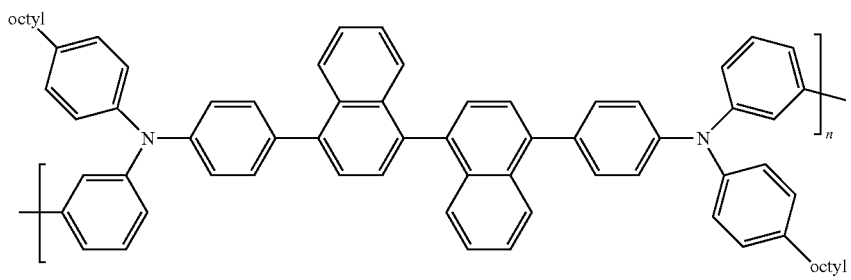
P41:
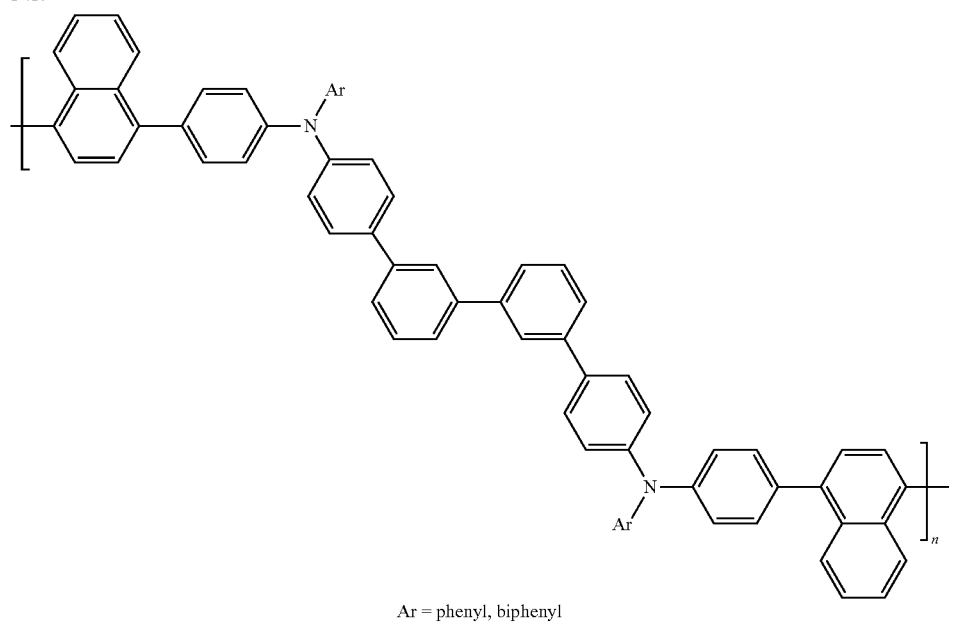
Ar = phenyl, biphenyl

-continued
P42:
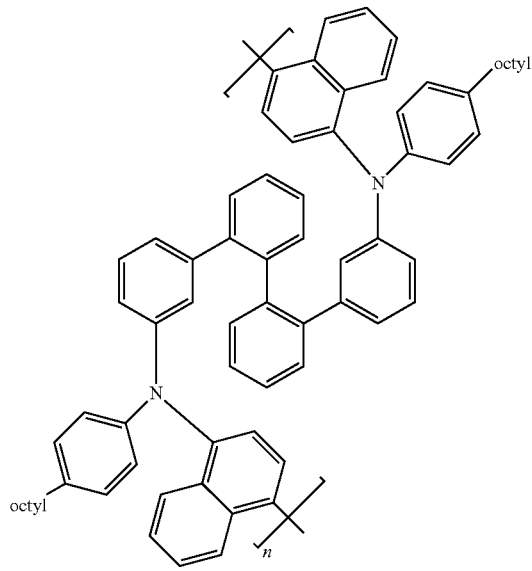
P43:
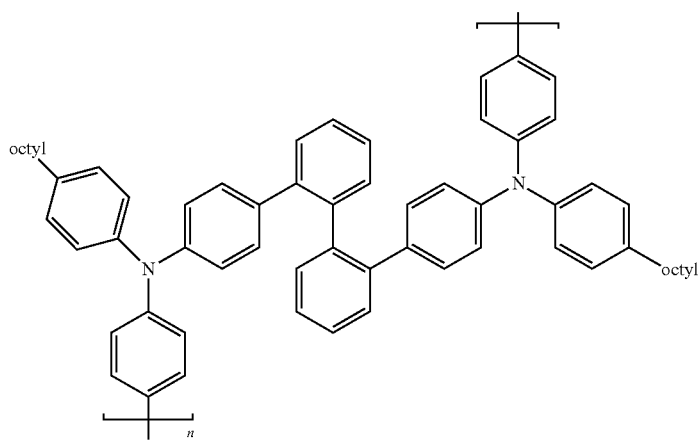
P44:
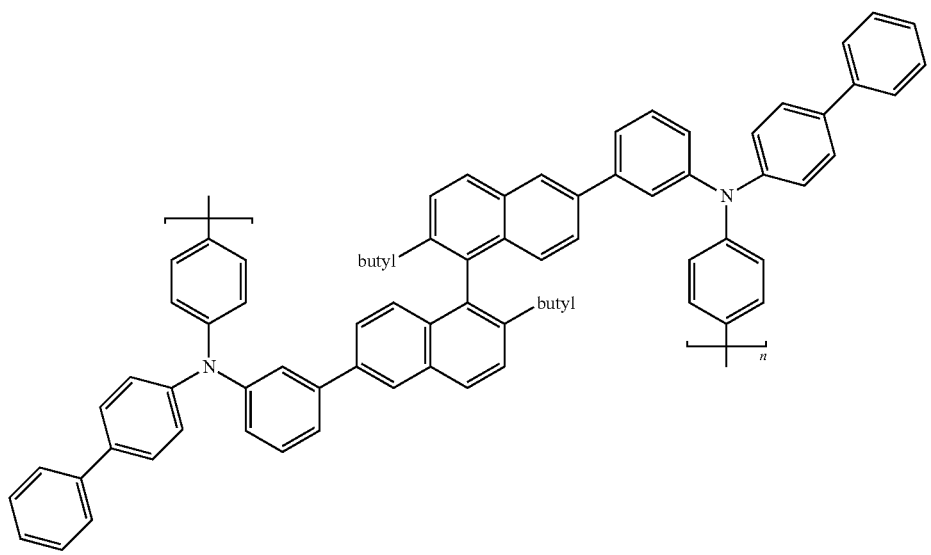

P45:
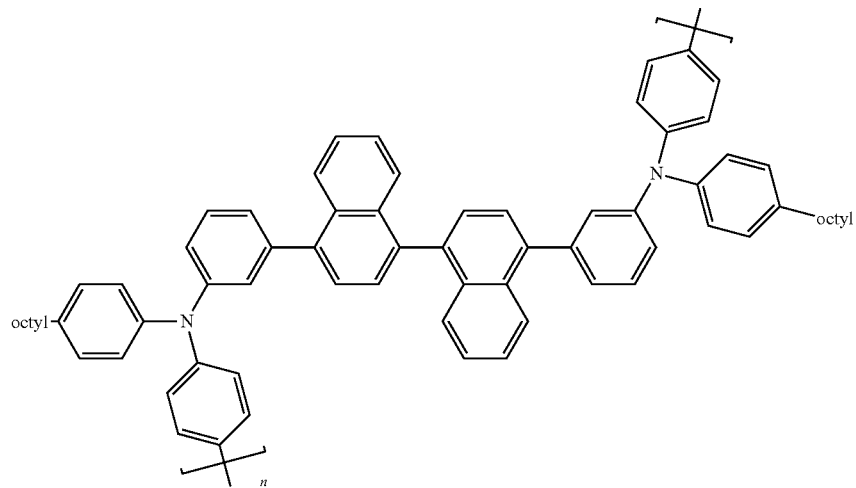
P46:
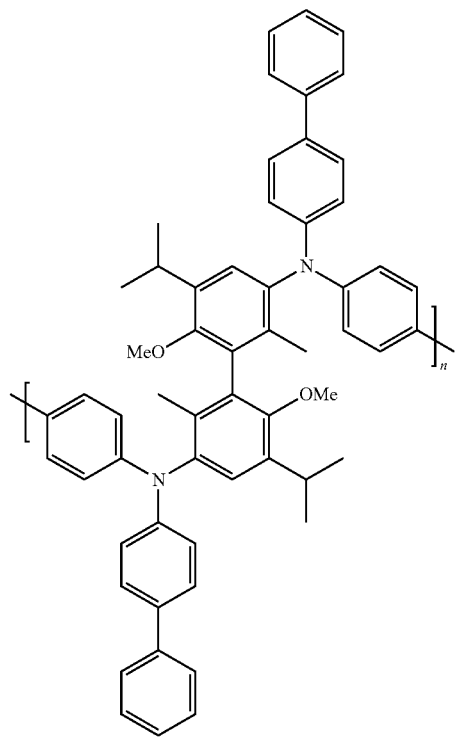

P47:
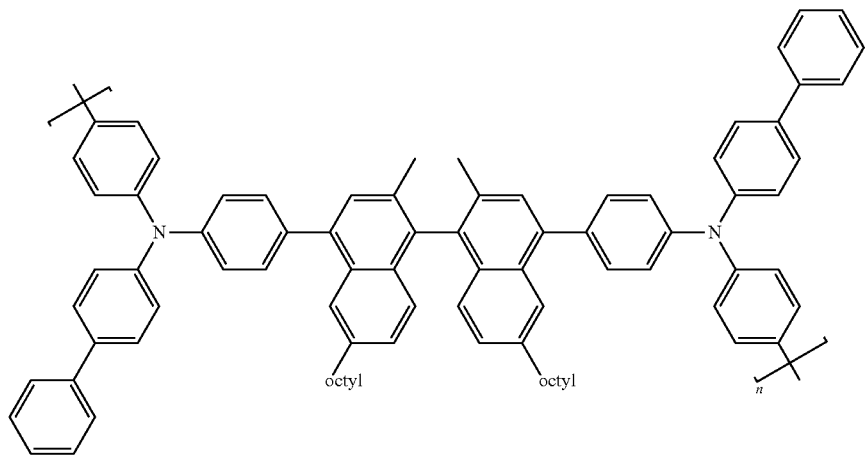
P48:
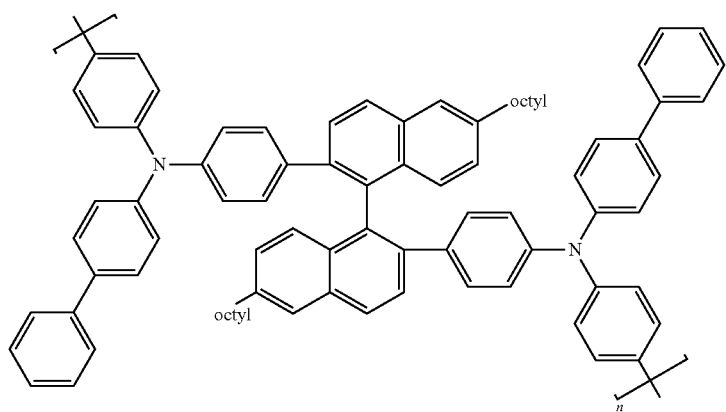
P49:
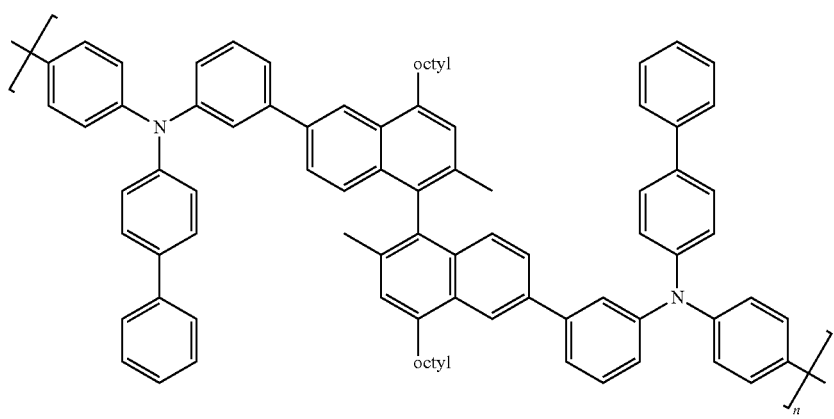

Some non-limiting examples of polymers having Formula X include P50 and P51.

P50:

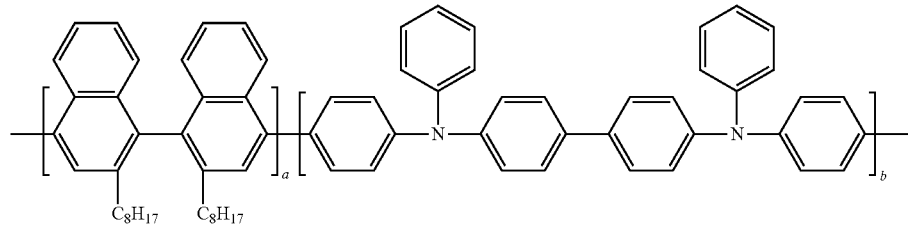

a=0.4-0.8
b=0.2-0.6

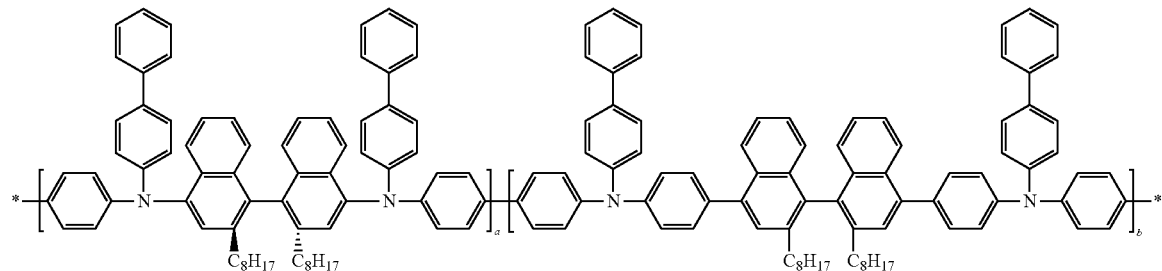

a=0.3 to 0.7
b=0.3 to 0.7

The polymers having Formula IX or X can be made using any technique that will yield a C—C or C—N bond. A variety of such techniques are known, such as Suzuki, Yamamoto, Stille, and Hartwig-Buchwald coupling. The compounds can be formed into layers using solution processing techniques. The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The polymers of Formula IX and X have hole mobilities and HOMO/LUMO energies similar to efficient small molecule hole transport compounds such as N,N'-diphenyl-N,N'-bis(3-methylphenyl)-[1,1'-biphenyl]-4,4'-diamine (TPD) and N,N'-bis(naphthalen-1-yl)-N,N'-bis-(phenyl)benzidine (α-NPB). Compounds such as TPD and NPD generally must be applied using a vapor deposition technique.

4. Hole Transport Composition and Layer

The hole transport composition comprises the first hole transport polymer and the second hole transport polymer. In some embodiments the ratio of first hole transport polymer to second hole transport polymer is in the range of 5:1 to 1:5; in some embodiments, the ratio is in the range of 2:1 to 1:2.

In some embodiments, the hole transport composition is a liquid composition. The term "liquid composition" is intended to mean a liquid medium in which a material is dissolved to form a solution, a liquid medium in which a material is dispersed to form a dispersion, or a liquid medium in which a material is suspended to form a suspension or an emulsion. The term "liquid medium" is intended to mean a liquid material, including a pure liquid, a combination of liquids, a solution, a dispersion, a suspension, and an emulsion. Liquid medium is used regardless whether one or more solvents are present.

Any liquid medium can be used so long as the two hole transport polymers can be dissolved or dispersed to form a solution, dispersion, suspension or an emulsion. In some embodiments the organic solvent is an aromatic solvent. In some embodiments, the organic liquid is selected from chloroform, dichloromethane, toluene, anisole, and mixtures thereof.

In some embodiments, the liquid composition can include other materials, such as photoinitiators, processing aids and the like. In some embodiments, the liquid composition consists essentially of the first hole transport polymer, the second hole transport polymer, and the liquid medium.

The hole transport composition can be formed into a hole transport layer using solution processing techniques. The term "layer" is used interchangeably with the term "film" and refers to a coating covering a desired area. The term is not limited by size. The area can be as large as an entire device or as small as a specific functional area such as the actual visual display, or as small as a single sub-pixel. The hole transport layer can be deposited from any liquid medium in which the two hole transport polymers are dissolved or dispersed and from which they will form a film. In one embodiment, the liquid medium consists essentially of one or more organic solvents. In one embodiment, the liquid medium consists essentially of water or water and an organic solvent. In one embodiment the organic solvent is an aromatic solvent. In one embodiment, the organic liquid is selected from chloroform, dichloromethane, toluene, anisole, and mixtures thereof. The hole transport material can be present in the liquid medium in a concentration of 0.2 to 2 percent by weight. Other weight percentages of hole transport material may be used depending upon the liquid medium. The hole transport layer can be applied by any continuous or discontinuous liquid deposition technique. In one embodiment, the hole transport layer is applied by spin coating. In one embodiment, the hole transport layer is applied by ink jet printing. After liquid deposition, the liquid medium can be removed in air, in an inert atmosphere, or by vacuum, at room temperature or with heating. In one embodiment, the layer is heated to a temperature of 300° C. or less. In one embodiment, the heating temperature is between 170° C. and 275° C. In one embodiment, the heating temperature is between 170° C. and 200° C. In one embodiment, the heating temperature is between 190° C. and 220° C. In one embodiment, the heating temperature is between 210° C. and 240° C. In one embodiment, the heating temperature is between 230° C. and 270° C. The heating time is dependent upon the temperature, and is generally between 5 and 60 minutes. In one embodiment, the final layer thickness is between 5 and 50 nm. In one embodiment, the final layer thickness is between 5 and 15 nm. In one embodiment, the final layer thickness is between 15 and 25 nm. In one embodiment, the final layer thickness is between 25 and 35 nm. In one embodiment, the final layer thickness is between 35 and 50 nm.

The hole transport layer is then treated to effect crosslinking. In some embodiments, crosslinking is accomplished by a thermal treatment. The exact temperature used will depend on the exact nature of the crosslinking groups. In general, temperatures of 100° C. to 200° C. are effective. In some embodiments, crosslinking is accomplished by exposure to radiation. The radiation should be of a wavelength at which the crosslinking group reacts to initiate the crosslinking reaction. In some embodiments, the radiation is UV or visible radiation. The time of the crosslinking treatment can vary. In general, times on the order of minutes are sufficient.

In some embodiments, the hole transport layer consists essentially of the crosslinked first hole transport polymer and the second hole transport polymer.

5. Electronic Devices

Organic electronic devices that may benefit from having the hole transport layer as described herein include, but are not limited to, (1) devices that convert electrical energy into radiation (e.g., a light-emitting diode, light emitting diode display, or diode laser), (2) devices that detect signals through electronics processes (e.g., photodetectors, photoconductive cells, photoresistors, photoswitches, phototransistors, phototubes, IR detectors), (3) devices that convert radiation into electrical energy, (e.g., a photovoltaic device or solar cell), and (4) devices that include one or more electronic components that include one or more organic semi-conductor layers (e.g., a transistor or diode). Other uses for the compositions according to the present invention include coating materials for memory storage devices, antistatic films, biosensors, electrochromic devices, solid electrolyte capacitors, energy storage devices such as a rechargeable battery, and electromagnetic shielding applications.

One illustration of an organic electronic device structure is shown in FIG. 1. The device 100 has an anode layer 110 and a cathode layer 150, and a photoactive layer 130 between them. Adjacent to the anode is a layer 120 comprising the hole transport composition described herein. Adjacent to the cathode may be a charge transport layer 140 comprising an electron transport material. As an option, devices may use one or more additional hole injection or hole transport layers (not shown) next to the anode 110 and/or one or more additional electron injection or electron transport layers (not shown) next to the cathode 150.

As used herein, the term "photoactive" refers to a material that emits light when activated by an applied voltage (such as in a light-emitting diode or light-emitting electrochemical cell), or responds to radiant energy and generates a signal with or without an applied bias voltage (such as in a photodetector). In one embodiment, a photoactive layer is an emitter layer.

Depending upon the application of the device 100, the photoactive layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector).

Examples of photodetectors include photoconductive cells, photoresistors, photoswitches, phototransistors, and phototubes, and photovoltaic cells, as these terms are described in Kirk-Othmer Concise Encyclopedia of Chemical Technology, $4^{th}$ edition, p. 1537, (1999).

The hole transport layer 120 comprises the hole transport composition described herein. In some embodiments, the hole transport layer consists essentially of the first hole transport polymer and the second hole transport polymer, which has been crosslinked, as described herein The other layers in the device can be made of any materials which are known to be useful in such layers. The anode 110, is an electrode that is particularly efficient for injecting positive charge carriers. It can be made of, for example materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8 10 transition metals. If the anode is to be light-transmitting, mixed-metal oxides of Groups 12, 13 and 14 metals, such as indium-tin-oxide, are generally used. The anode 110 may also comprise an organic material such as polyaniline as described in "Flexible light-emitting diodes made from soluble conducting polymer," Nature vol. 357, pp 477 479 (11 Jun. 1992). At least one of the anode and cathode should be at least partially transparent to allow the generated light to be observed.

In some embodiments, the device further comprises a buffer layer between the anode and the layer comprising the new polymer. The term "buffer layer" is intended to mean a layer comprising electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Buffer materials may be polymers, oligomers, or small molecules, and may be in the form of solutions, dispersions, suspensions, emulsions, colloidal mixtures, or other compositions. The buffer layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The buffer layer can comprise charge transfer compounds, and the like, such as copper phthalocyanine and the tetrathiafulvalene-tetracyanoquinodimethane system (TTF-TCNQ). In one embodiment, the buffer layer is made from a dispersion of a conducting polymer and a colloid-forming polymeric acid.

Such materials have been described in, for example, published U.S. patent applications 2004-0102577, 2004-0127637, and 2005/205860.

Any organic electroluminescent ("EL") material can be used as the photoactive material in layer 130. Such materials include, but are not limited to, one of more compounds of the instant invention, small organic fluorescent compounds, fluorescent and phosphorescent metal complexes, conjugated polymers, and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, and mixtures thereof. Examples of conjugated polymers include, but are not limited to poly(phenylenevinylenes), polyfluorenes, poly (spirobifluorenes), polythiophenes, poly(p-phenylenes), copolymers thereof, and mixtures thereof. The materials may also be present in admixture with a host material. In some embodiments, the host material is a hole transport material or an electron transport material. In some embodiments, the host is the new electroactive compound described herein. In some embodiments, the ratio of host material to photoactive material is in the range of 5:1 to 20:1; in some embodiments, 10:1 to 15:1.

Examples of electron transport materials which can be used in the electron transport layer 140 and/or the optional layer between layer 140 and the cathode include metal chelated oxinoid compounds, such as tris(8-hydroxyquinolato) aluminum (AlQ), bis(2-methyl-8-quinolinolato)(p-phenylphenolato) aluminum (BAlq), tetrakis-(8-hydroxyquinolato)hafnium (HfQ) and tetrakis-(8-hydroxyquinolato)zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole) benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof.

The cathode 150, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li-containing organometallic compounds, LiF, and $Li_2O$ can also be deposited between the organic layer and the cathode layer to lower the operating voltage.

The choice of materials for each of the component layers is preferably determined by balancing the goals of providing a device with high device efficiency with device operational lifetime. Other layers may also be present in the device. There may be one or more hole injection and/or hole transport layers between the buffer layer and the organic active layer. There may be one or more electron transport layers and/or electron injection layers between the organic active layer and the cathode.

The device can be prepared by a variety of techniques, including sequentially depositing the individual layers on a suitable substrate. Substrates such as glass and polymeric films can be used. Conventional vapor deposition techniques can be used, such as thermal evaporation, chemical vapor deposition, and the like. Alternatively, the organic layers can be applied by liquid deposition using suitable solvents. The liquid can be in the form of solutions, dispersions, or emulsions. Typical liquid deposition techniques include, but are not limited to, continuous deposition techniques such as spin coating, gravure coating, curtain coating, dip coating, slot-die coating, spray-coating, and continuous nozzle coating; and discontinuous deposition techniques such as ink jet printing, gravure printing, and screen printing. any conventional coating or printing technique, including but not limited to spin-coating, dip-coating, roll-to-roll techniques, ink jet printing, screen-printing, gravure printing and the like.

In one embodiment, the different layers have the following range of thicknesses: anode 110, 500-5000 Å, in one embodiment 1000-2000 Å; hole transport layer 120, 50-2000 Å, in one embodiment 200-1000 Å; photoactive layer 130, 10-2000 Å, in one embodiment 100-1000 Å; layer 140, 50-2000 Å, in one embodiment 100-1000 Å; cathode 150, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

In one embodiment, the device has the following structure, in order: anode, buffer layer, hole transport layer, photoactive layer, electron transport layer, electron injection layer, cathode. In one embodiment, the anode is made of indium tin oxide or indium zinc oxide. In one embodiment, the buffer layer comprises a conducting polymer selected from the group consisting of polythiophenes, polyanilines, polypyrroles, copolymers thereof, and mixtures thereof. In one embodiment, the buffer layer comprises a complex of a conducting polymer and a colloid-forming polymeric acid.

In one embodiment, the photoactive layer comprises an electroluminescent metal complex and a host material. The host can be a charge transport material.

In one embodiment, the electron transport layer comprises a metal complex of a hydroxyaryl-N-heterocycle. In one embodiment, the hydroxyaryl-N-heterocycle is unsubstituted or substituted 8-hydroxyquinoline. In one embodiment, the metal is aluminum. In one embodiment, the electron transport layer comprises a material selected from the group consisting of tris(8-hydroxyquinolinato)aluminum, bis(8-hydroxyquinolinato)(4-phenylphenolato)aluminum, tetrakis(8-hydroxyquinolinato)zirconium, tetrakis(8-hydroxyquinolinato) hafnium, and mixtures thereof.

In one embodiment, the electron injection layer is LiF, CsF, or $Li_2O$. In one embodiment, the cathode is Al or Ba/Al.

In one embodiment, there is an electron transport layer comprising a material selected from the group consisting of tris(8-hydroxyquinolinato)aluminum, bis(8-hydroxyquinolinato)(4-phenylphenolato)aluminum, tetrakis(8-hydroxyquinolinato)zirconium, tetrakis(8-hydroxyquinolinato) hafnium, and mixtures thereof, and an electron injection layer comprising LiF or $Li_2O$.

In one embodiment, the device is fabricated by liquid deposition of the buffer layer, the hole transport layer, and the photoactive layer, and by vapor deposition of the electron transport layer, the electron injection layer, and the cathode.

In one embodiment, the device is fabricated by liquid deposition of the buffer layer, the hole transport layer, and at least one color for the photoactive layer, and by vapor deposition of at least one color for the photoactive layer, the electron transport layer, the electron injection layer, and the cathode.

Although methods and materials similar or equivalent to those described herein can be used in the practice or testing of the present invention, suitable methods and materials are described below. In addition, the materials, methods, and examples are illustrative only and not intended to be limiting. All publications, patent applications, patents, and other references mentioned herein are incorporated by reference in their entirety.

EXAMPLES

The concepts described herein will be further described in the following examples, which do not limit the scope of the invention described in the claims.

Materials:

Buffer 1 is an aqueous dispersion of polypyrrole and a polymeric fluorinated sulfonic acid. The material was prepared using a procedure similar to that described in Example 1 of published U.S. patent application no. 2005/0205860.

P33, with the structure as shown above, was prepared using a procedure similar to that of Example 2 in published application US 2008/0071049.

P35, with the structure as shown above, was prepared using a procedure similar to that of Example 1 in published application US 2008/0071049.

P38, with the structure as shown above, was prepared using a procedure similar to that disclosed in published PCT application WO 2006/063852.

Hosts H1 and H2 are anthracene derivatives. Such materials have been described in, for example, U.S. Pat. No. 7,023,013.

Dopants E1 and E2 are arylamine compounds. Such materials have been described in, for example, U.S. published patent application US 2006/0033421.

AlQ is tris-(8-hydroxyquinoline) aluminum
ZrQ is tetrakis-(8-hydroxyquinoline) zirconium

Example 1 and Comparative Example A

This example demonstrates the fabrication and performance of a device using a blended hole transport layer, where the emissive layer is formed by liquid deposition.

The following materials were used:
Indium Tin Oxide (ITO): 50 nm
buffer layer=Buffer 1 (15 nm)
hole transport layer=polymer(s) shown below (20 nm)
photoactive layer=13:1 host H1:dopant E1 (48 nm)
electron transport layer=(ZrQ) (20 nm)
cathode=LiF/Al (0.5/100 nm)
For Example 1: the hole transport material was a 3:1 mixture (by weight) of P33 and P38
For Comparative Example A: the hole transport material was P33.

OLED devices were fabricated by a combination of solution processing and thermal evaporation techniques. Patterned indium tin oxide (ITO) coated glass substrates from Thin Film Devices, Inc were used. These ITO substrates are based on Corning 1737 glass coated with ITO having a sheet resistance of 50 ohms/square and 80% light transmission. The patterned ITO substrates were cleaned ultrasonically in aqueous detergent solution and rinsed with distilled water. The patterned ITO was subsequently cleaned ultrasonically in acetone, rinsed with isopropanol, and dried in a stream of nitrogen.

Immediately before device fabrication the cleaned, patterned ITO substrates were treated with UV ozone for 10 minutes. Immediately after cooling, an aqueous dispersion of Buffer 1 was spin-coated over the ITO surface and heated to remove the aqueous liquid. After cooling, the substrates were then spin-coated with a solution of the hole transport material in a first organic solvent, and then heated to remove the solvent. After cooling, the substrates were spin-coated with a solution of the emissive layer in a second organic solvent, and heated to remove the solvent. The substrates were masked and placed in a vacuum chamber. A ZrQ layer was deposited by thermal evaporation, followed by a layer of LiF. Masks were then changed in vacuo and a layer of Al was deposited by thermal evaporation. The chamber was vented, and the devices were encapsulated using a glass lid, desiccant, and UV curable epoxy.

The OLED samples were characterized by measuring their (1) current-voltage (I-V) curves, (2) electroluminescence radiance versus voltage, and (3) electroluminescence spectra versus voltage. All three measurements were performed at the same time and controlled by a computer. The current efficiency of the device at a certain voltage is determined by dividing the electroluminescence radiance of the LED by the current density needed to run the device. The unit is a cd/A. The power efficiency is the current efficiency divided by the operating voltage. The unit is lm/W. The results are given in Table 1.

TABLE 1

| Sample | CE [cd/A] | Voltage [V] | EL peak [nm] | CIE [x] | CIE [y] | Lum. ½ Life [h] |
|---|---|---|---|---|---|---|
| Ex. 1 | 4.2 | 4.2 | 464 | 0.139 | 0.159 | 8,600 |
| Comp. Ex. A | 4.6 | 4.8 | 464 | 0.138 | 0.153 | 6,000 |

*All data @ 2000 nits, CE = current efficiency, LT @ 24° C. projected for 1000 nit operation.

Examples 2 and 3 and Comparative Examples B and C

These examples demonstrate the fabrication and performance of devices using a blended hole transport layer, where the emissive layer is formed by vapor deposition.

The following materials were used:
Indium Tin Oxide (ITO): 50 nm
buffer layer=Buffer 1 (15 nm)
hole transport layer=polymer(s) shown below (20 nm)
photoactive layer=13:1 host H2:dopant E2 (40 nm)
electron transport layer=AlQ (20 nm)
cathode=LiF/Al (0.5/100 nm)
For Example 2: the hole transport material was a 1:9 mixture (by weight) of P33 and P35
For Example 3: the hole transport material was a 1:1 mixture (by weight) of P33 and P38
For Comparative Example B: the hole transport material was P33.
For Comparative Example C: the hole transport material was P38.

OLED devices were fabricated by a combination of solution processing and thermal evaporation techniques. Patterned indium tin oxide (ITO) coated glass substrates from Thin Film Devices, Inc were used. These ITO substrates are based on Corning 1737 glass coated with ITO having a sheet resistance of 50 ohms/square and 80% light transmission. The patterned ITO substrates were cleaned ultrasonically in aqueous detergent solution and rinsed with distilled water. The patterned ITO was subsequently cleaned ultrasonically in acetone, rinsed with isopropanol, and dried in a stream of nitrogen.

Immediately before device fabrication the cleaned, patterned ITO substrates were treated with UV ozone for 10 minutes. Immediately after cooling, an aqueous dispersion of Buffer 1 was spin-coated over the ITO surface and heated to remove solvent. After cooling, the substrates were then spin-coated with a solution of the hole transport material, and then heated to remove solvent. After cooling, the substrates were masked and loaded into the vacuum chamber. A 13:1 ratio of fluorescent host:dopant was co-evaporated to a thickness of 40 nm. The substrates were masked and placed in a vacuum chamber. A ZrQ layer was deposited by thermal evaporation, followed by a layer of LiF. Masks were then changed in vacuo and a layer of Al was deposited by thermal evaporation. The chamber was vented, and the devices were encapsulated using a glass lid, desiccant, and UV curable epoxy.

The OLED samples were characterized by measuring their (1) current-voltage (1-V) curves, (2) electroluminescence radiance versus voltage, and (3) electroluminescence spectra versus voltage. All three measurements were performed at the same time and controlled by a computer. The current efficiency of the device at a certain voltage is determined by dividing the electroluminescence radiance of the LED by the current density needed to run the device. The unit is a cd/A. The power efficiency is the current efficiency divided by the operating voltage. The unit is lm/W. The results are given in Table 2.

TABLE 2

| Sample | CE [cd/A] | Voltage [V] | EL peak [nm] | CIE [x] | CIE [y] | Lum. ½ Life [h] |
|---|---|---|---|---|---|---|
| Ex. 2 | 3.5 | 5.8 | 462 | 0.139 | 0.131 | 4900 |
| Comp. Ex. B | 3.8 | 5.8 | 462 | 0.139 | 0.131 | 3300 |
| Ex. 3 | 5.7 | 6.0 | 460 | 0.138 | 0.124 | 9300 |
| Comp. Ex. C | 5.2 | 5.7 | 460 | 0.139 | 0.125 | 6900 |

*All data @ 2000 nits, CE = current efficiency, LT @ 24° C. projected for 1000 nit operation.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. A hole transport composition comprising (i) a first hole transport polymer made from at least one first monomer selected from A1, A2, and A3

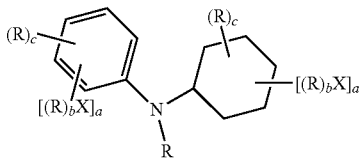

A1

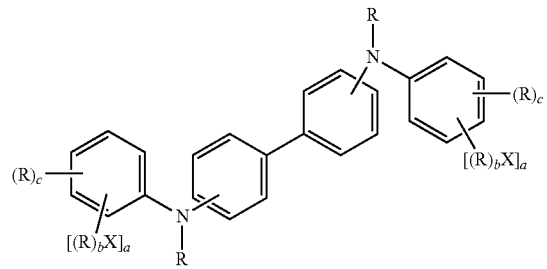

A2

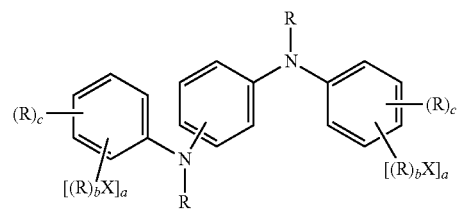

A3 where:
R is the same or different at each occurrence and is selected from the group consisting of H, D, alkyl, fluoroalkyl, aryl, fluoroaryl, alkoxy, aryloxy, NR"$_2$, R',

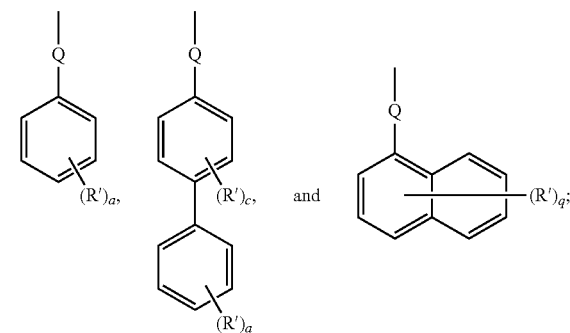

R' is a crosslinkable group;
R" is independently selected from the group consisting of H, alkyl, fluoroalkyl, aryl, fluoroaryl, and R';
X can be the same or different at each occurrence and is a leaving group;
Z is C, Si, or N;
Q is the same or different at each occurrence and is $(ZR''_n)_b$;
a is an integer from 0 to 5;
b is an integer from 0 to 20;
c is an integer from 0 to 4;
q is an integer from 0 to 7; and
n is an integer from 1 to 2;
wherein there is at least one crosslinkable group;
and (ii) a second hole transport polymer having substantially no crosslinkable groups, wherein said second hole transport polymer is selected from the group consisting of a polymer having Formula (IX), and a polymer having Formula X:

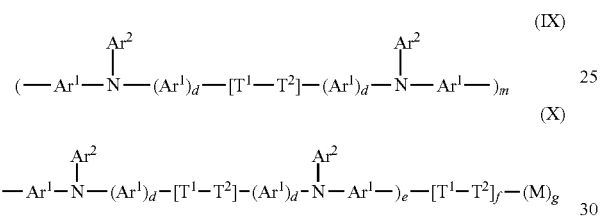

wherein:
Ar¹ is the same or different at each occurrence and is selected from the group consisting of phenylene and naphthylene;
Ar² is the same or different at each occurrence and is an aryl group;
M is the same or different at each occurrence and is a conjugated moiety;
T¹ and T² are independently the same or different at each occurrence and are conjugated moieties which are connected in a non-planar configuration;
d is an integer from 1 to 6;
e, f, and g are mole fractions such that e+f+g=1.0, with the proviso that f is not zero, and at least one of e and g is not zero, and when e is zero, M comprises at least two triarylamine units; and
m is an integer greater than 5.

2. The hole transport composition of claim 1, wherein the polymer is a copolymer of at least one monomer selected from A1 through A5 and at least one monomer selected from B1 through B6 or C1 through C6:

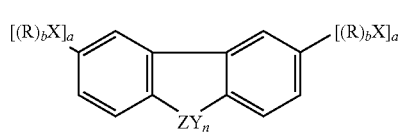
B1

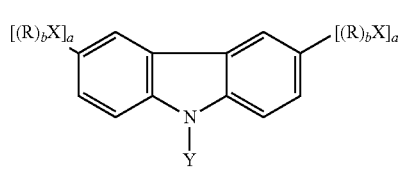
B2

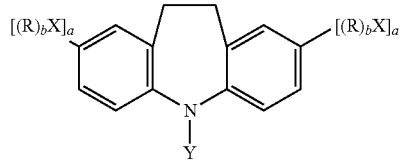
B3

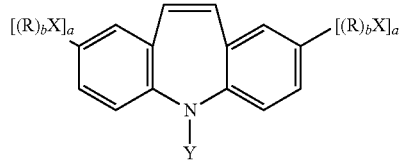
B4

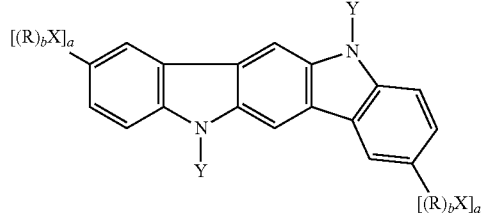
B5

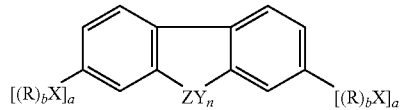
B6

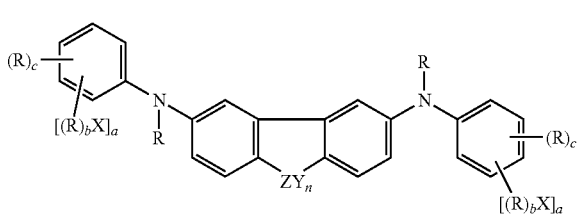
C1

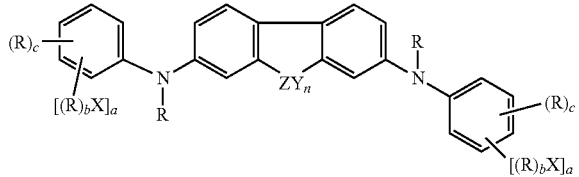
C2

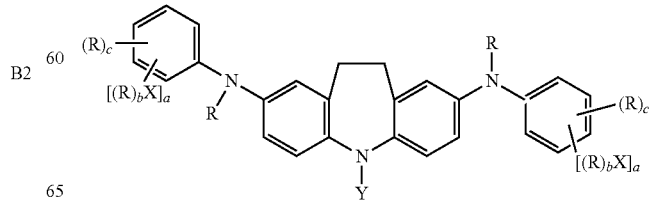
C3

-continued

C4
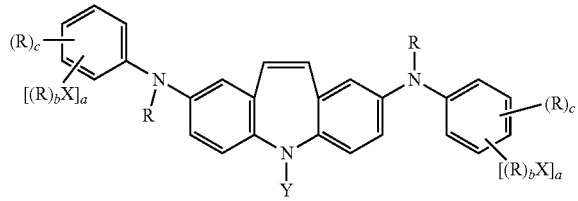

C5
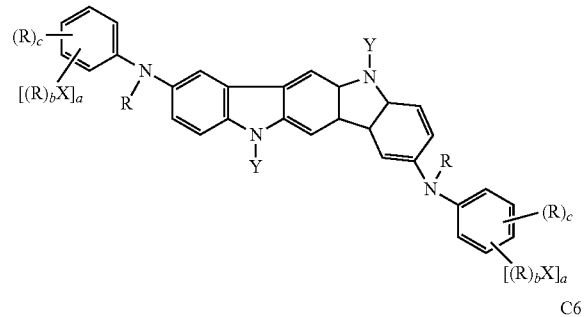

C6
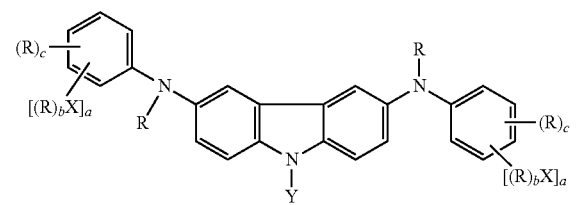

where:
R and Y are independently selected from the group consisting of H, D, alkyl, fluoroalkyl, aryl, fluoroaryl, alkoxy, aryloxy, NR"2, R',

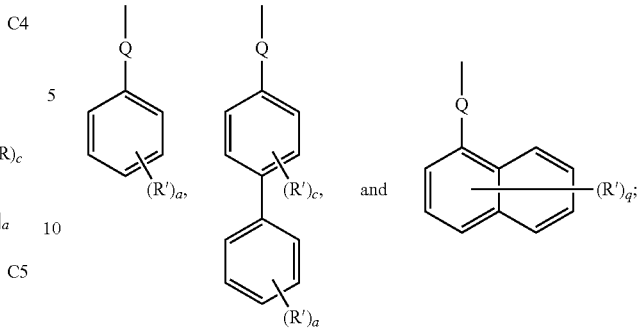

R' is a crosslinkable group;
R" is independently selected from the group consisting of H, alkyl, fluoroalkyl, aryl, fluoroaryl, and R';
X can be the same or different at each occurrence and is a leaving group;
Z is C, Si, or N;
E is the same or different at each occurrence and is $(ZR''_n)_b$, O, S, Se, or Te;
Q is the same or different at each occurrence and is $(ZR''_n)_b$;
a is an integer from 0 to 5;
b is an integer from 0 to 20;
c is an integer from 0 to 4;
q is an integer from 0 to 7; and
n is an integer from 1 to 2;
with the proviso that at least one of the monomers contains a crosslinkable group.

3. The hole transport composition of claim 1, wherein $T^1$ and $T^2$ are selected from the group consisting of phenylene, napthylene, and anthracenyl groups.

4. A crosslinked hole transport layer made from the composition of claim 1.

5. An electronic device comprising the crosslinked hole transport layer of claim 4.

* * * * *